(12) United States Patent
Shih

(10) Patent No.: US 12,272,651 B2
(45) Date of Patent: Apr. 8, 2025

(54) SEMICONDUCTOR PACKAGE STRUCTURE HAVING INTERCONNECTIONS BETWEEN DIES AND MANUFACTURING METHOD THEREOF

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 461 days.

(21) Appl. No.: 17/864,470

(22) Filed: Jul. 14, 2022

(65) Prior Publication Data
US 2024/0021527 A1 Jan. 18, 2024

(51) Int. Cl.
*H01L 23/538* (2006.01)
*H01L 25/00* (2006.01)
(Continued)

(52) U.S. Cl.
CPC ...... *H01L 23/5385* (2013.01); *H01L 23/5386* (2013.01); *H01L 25/0652* (2013.01);
(Continued)

(58) Field of Classification Search
CPC .......... H10B 80/00; H01L 2225/06527; H01L 2225/06541; H01L 2224/06181; H01L 2224/08145; H01L 2224/08225; H01L 2224/80895; H01L 2224/80896; H01L 25/0652; H01L 25/18; H01L 25/50; H01L 24/06; H01L 24/08; H01L 24/16; H01L 24/80; H01L 24/81; H01L 21/56; H01L 21/60

See application file for complete search history.

(56) References Cited

U.S. PATENT DOCUMENTS

2012/0096322 A1* 4/2012 Huh ..................... G06F 11/1008
714/719
2022/0165722 A1* 5/2022 Park ....................... H01L 25/50

FOREIGN PATENT DOCUMENTS

CN 112018102 A 12/2020
TW M600937 U 9/2020
(Continued)

*Primary Examiner* — Kyoung Lee
*Assistant Examiner* — Christina A Sylvia
(74) *Attorney, Agent, or Firm* — Xuan Zhang

(57) ABSTRACT

The present application provides a semiconductor package structure having interconnections between dies, and a manufacturing method of the semiconductor package structure. The semiconductor package structure includes a first interposer including a first substrate and a first interconnect layer over the first substrate; a second interposer disposed over the first interposer, wherein the second interposer includes a second substrate and a second interconnect layer over the second substrate; a first die disposed over the first interposer and adjacent to the second interposer; a second die disposed over the second interposer; a first molding disposed over the second interposer and surrounding the second die; and a second molding disposed over the first interposer and surrounding the first die and the first molding, wherein the first interconnect layer includes a first communication member electrically connecting the first die to the second interposer and the second die.

18 Claims, 42 Drawing Sheets

(51) Int. Cl.
 *H01L 25/065* (2023.01)
 *H01L 25/18* (2023.01)
 *H01L 23/00* (2006.01)

(52) U.S. Cl.
 CPC .............. *H01L 25/18* (2013.01); *H01L 25/50* (2013.01); *H01L 24/06* (2013.01); *H01L 24/08* (2013.01); *H01L 2224/06181* (2013.01); *H01L 2224/08145* (2013.01); *H01L 2224/08225* (2013.01)

(56) References Cited

FOREIGN PATENT DOCUMENTS

| | | |
|---|---|---|
| TW | 202036810 A | 10/2020 |
| TW | 202213689 A | 4/2022 |

\* cited by examiner

SEMICONDUCTOR PACKAGE STRUCTURE HAVING INTERCONNECTIONS BETWEEN DIES AND MANUFACTURING METHOD THEREOF

TECHNICAL FIELD

The present disclosure relates to a semiconductor package structure, and a method of manufacturing the semiconductor package structure. Particularly, the present disclosure relates to a semiconductor package structure having interconnections between dies, and a method of manufacturing the semiconductor package structure including forming the interconnections between dies.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of the manufacturing process. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package structure. The semiconductor package structure includes a first interposer including a first substrate and a first interconnect layer over the first substrate; a second interposer disposed over the first interposer, wherein the second interposer includes a second substrate and a second interconnect layer over the second substrate; a first die disposed over the first interposer and adjacent to the second interposer; a second die disposed over the second interposer; a first molding disposed over the second interposer and surrounding the second die; and a second molding disposed over the first interposer and surrounding the first die and the first molding, wherein the first interconnect layer includes a first communication member electrically connecting the first die to the second interposer and the second die.

In some embodiments, the first communication member is disposed under the second molding.

In some embodiments, the second substrate is disposed between the second die and the second interconnect layer.

In some embodiments, a thickness of the first die is substantially equal to a total of a thickness of the second interposer and a thickness of the second die.

In some embodiments, the first interposer is an inactive interposer, and the second interposer is an active interposer.

In some embodiments, the first die is a logic die and the second die is a DRAM die.

In some embodiments, the semiconductor package structure further includes a third die disposed over the second interposer, surrounded by the first molding and disposed adjacent to the second die.

In some embodiments, the second interposer defines a first control area under the second die, and a second control area adjacent to the first control area and under the third die.

In some embodiments, the first interconnect layer includes a second communication member electrically connecting the first die to the third die.

In some embodiments, the second communication member is disposed under the second molding.

In some embodiments, the second interconnect layer includes a third communication member electrically connecting the second die to the third die.

In some embodiments, the third communication member is disposed under the first molding.

In some embodiments, the second die and the third die are memory dies.

In some embodiments, the third die is a Flash memory die.

Another aspect of the present disclosure provides a semiconductor package structure. The semiconductor package structure includes a first interposer, wherein the first interposer includes a first substrate, a first bonding layer over the first substrate, a first bonding pad at least partially exposed through the first bonding layer, a first communication member disposed within the first bonding layer, and a second communication member disposed within the first bonding layer; a second interposer disposed over the first interposer, wherein the second interposer includes a second substrate, a second bonding layer under the second substrate and bonded to the first bonding layer, a second bonding pad at least partially exposed through the second dielectric layer and bonded to the first bonding pad, a dielectric layer disposed over the second substrate, and a third communication member disposed within the dielectric layer; a first die disposed over the first bonding layer and adjacent to the second interposer; a second die disposed over the second interposer; and a third die disposed over the second interposer and adjacent to the second die, wherein the first communication member electrically connects the first die to the second interposer and the second die, the second communication member electrically connects the first die to the third die, and the third communication member electrically connects the second die to the third die.

In some embodiments, the first die includes a first die pad bonded to a third bonding pad of the first interposer, wherein the third bonding pad is at least partially exposed through the first bonding layer.

In some embodiments, the second die includes a second die pad bonded to a fourth bonding pad of the second interposer, wherein the fourth bonding pad is at least partially exposed through the dielectric layer; and the third die includes a third die pad bonded to a fifth bonding pad of the second interposer, wherein the fifth bonding pad is at least partially exposed through the dielectric layer.

In some embodiments, the fourth bonding pad is electrically connected to the fifth bonding pad via the third communication member.

In some embodiments, the semiconductor package structure further includes a first molding disposed over the dielectric layer and surrounding the second die and the third die, and a second molding disposed over the first bonding layer and surrounding the first die, the first molding and the second interposer.

In some embodiments, the semiconductor package structure further includes a first via extending through the first substrate; a conductive bump disposed under the first substrate and electrically coupled to the first via; and a second via extending through the second substrate, wherein the first die is electrically connected to the second die via the first communication member and the second via.

Another aspect of the present disclosure provides a method of manufacturing a semiconductor package structure. The method includes steps of providing a first interposer including a first substrate and a first interconnect layer over the first substrate, wherein the first interconnect layer includes a first communication member and a second communication member; providing a second interposer including a second substrate and a second interconnect layer over the second substrate, wherein the second interconnect layer includes a third communication member; disposing a first die over the first interposer; forming an intermediate structure including: disposing a second die over the second interposer, disposing a third die over the second interposer and adjacent to the second die, and forming a first molding disposed over the second interposer and surrounding the second die and the third die; disposing the intermediate structure over the first interposer; and forming a second molding over the first interposer and surrounding the first die and the intermediate structure.

In some embodiments, the first interconnect layer includes a first bonding layer over the first substrate and a first bonding pad at least partially exposed through the first bonding layer, and the second interposer includes a second bonding layer formed under the second substrate and a second bonding pad at least partially exposed through the second bonding layer.

In some embodiments, the intermediate structure is disposed by bonding the second bonding layer to the first bonding layer and bonding the first bonding pad to the second bonding pad.

In some embodiments, the intermediate structure is disposed by hybrid bonding.

In some embodiments, the second bonding layer and the second bonding pad are formed after the formation of the first molding.

In some embodiments, the first interconnect layer includes a third bonding pad at least partially exposed through the first bonding layer, and the first die includes a first die pad.

In some embodiments, the first die is disposed over the first interposer by bonding the first die pad to the third bonding pad.

In some embodiments, the first die is disposed over the first interposer by hybrid bonding.

In some embodiments, the intermediate structure is formed before or after the disposing of the first die.

In some embodiments, the first molding is formed prior to the formation of the second molding.

In some embodiments, the disposing of the second die and the disposing of the third die are implemented simultaneously or separately.

In some embodiments, the first molding is formed after the disposing of the second die and the disposing of the third die.

In some embodiments, the disposing of the first die and the disposing of the intermediate structure are implemented simultaneously or separately.

In some embodiments, the method further comprises disposing a conductive bump under the first interposer after the formation of the second molding.

In some embodiments, the formation of the second molding includes disposing a molding material to surround the intermediate structure and the first die, and grinding the molding material to expose a top surface of the first die and a top surface of the first molding.

In conclusion, because communication members are included in an inactive interposer of a semiconductor package structure, a logic die can communicate with several memory dies. Further, a communication member is included in an active interposer of the semiconductor package structure, so that the memory dies can communicate with each other. Therefore, an operation speed of the semiconductor package structure can be increased or improved. An overall dimension of the semiconductor package structure can be reduced.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
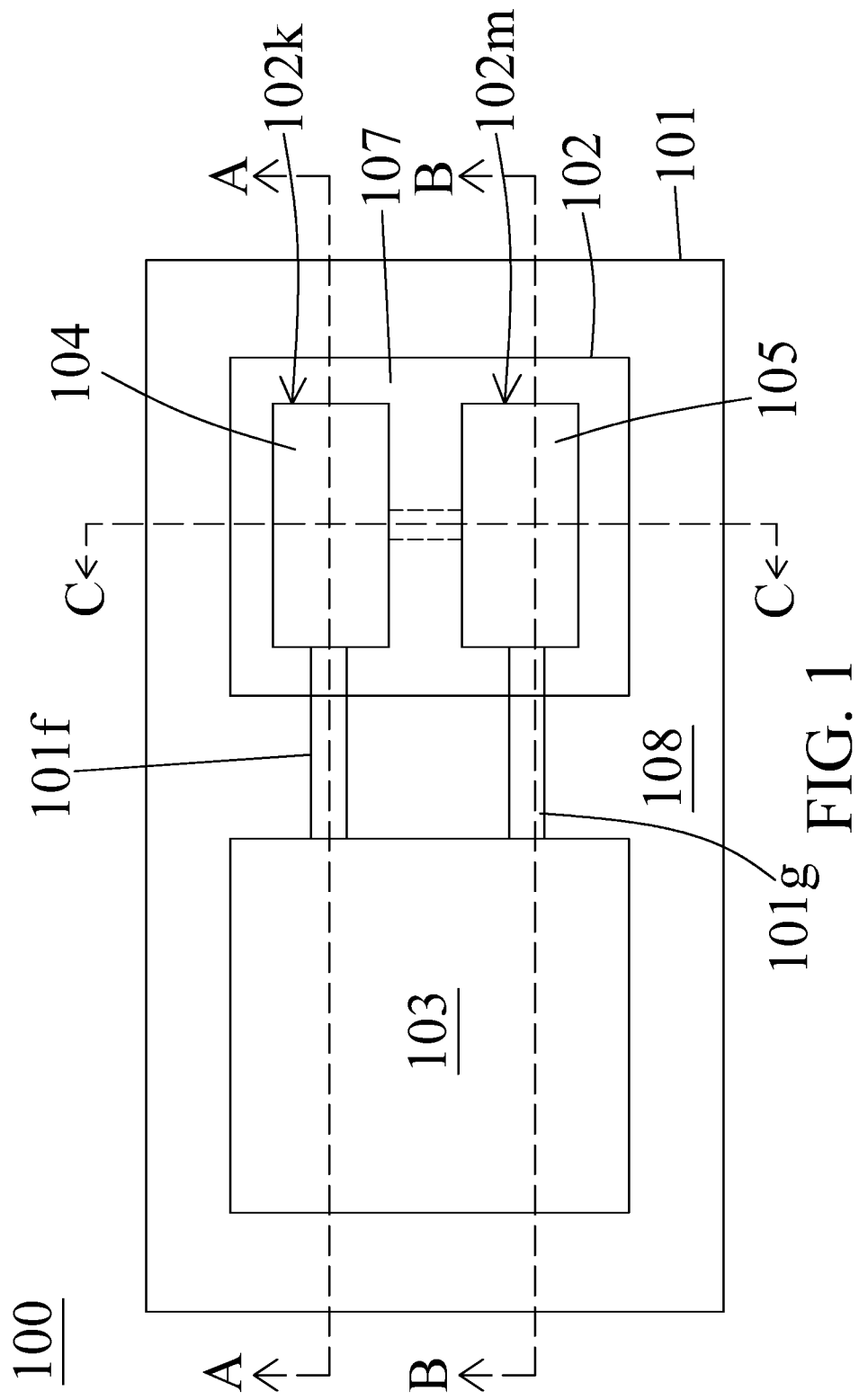
FIG. 1 is a top view of a semiconductor package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
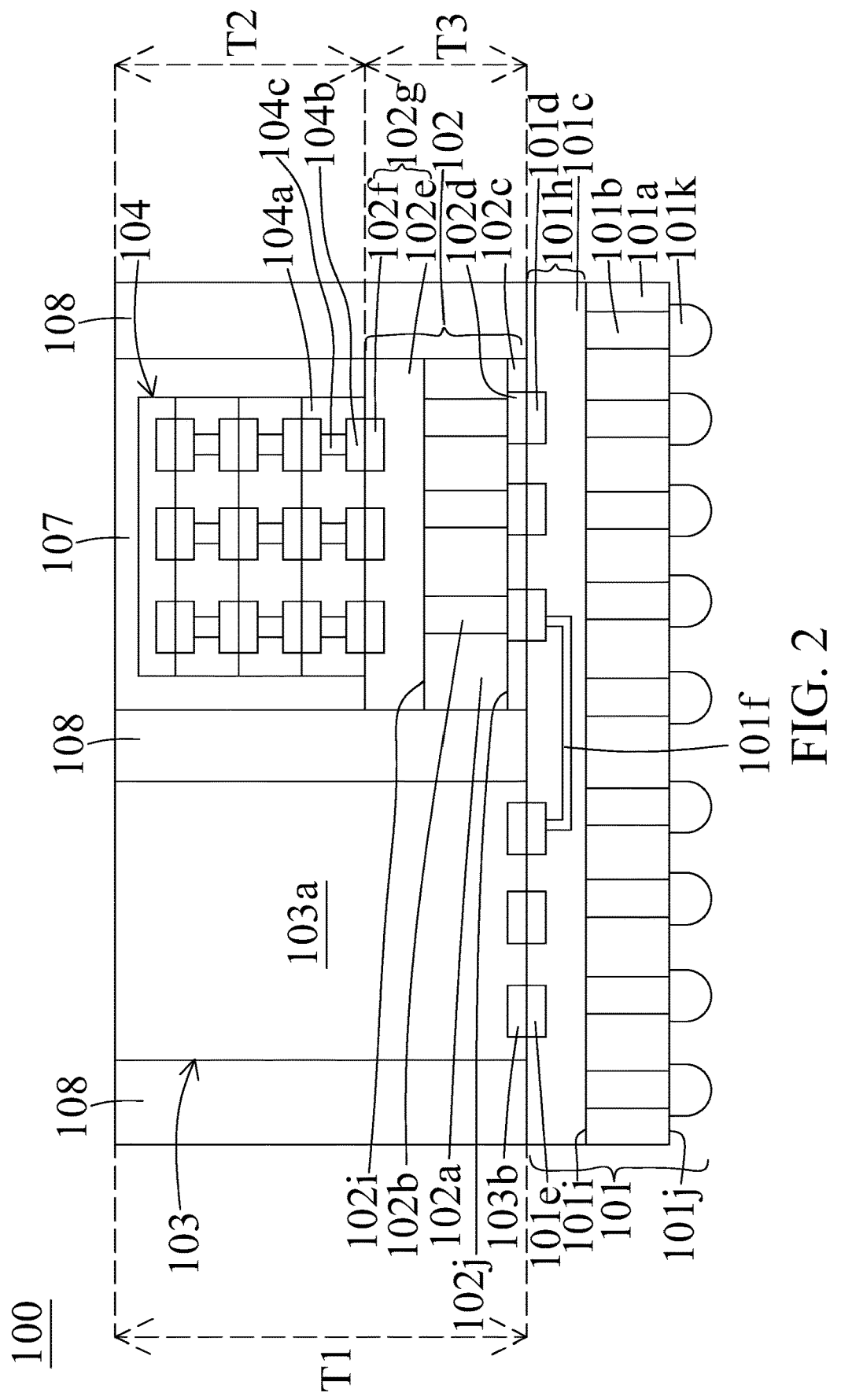
FIG. 2 is a cross-sectional view of the semiconductor package structure along a line A-A of FIG. 1.
Figure 3:
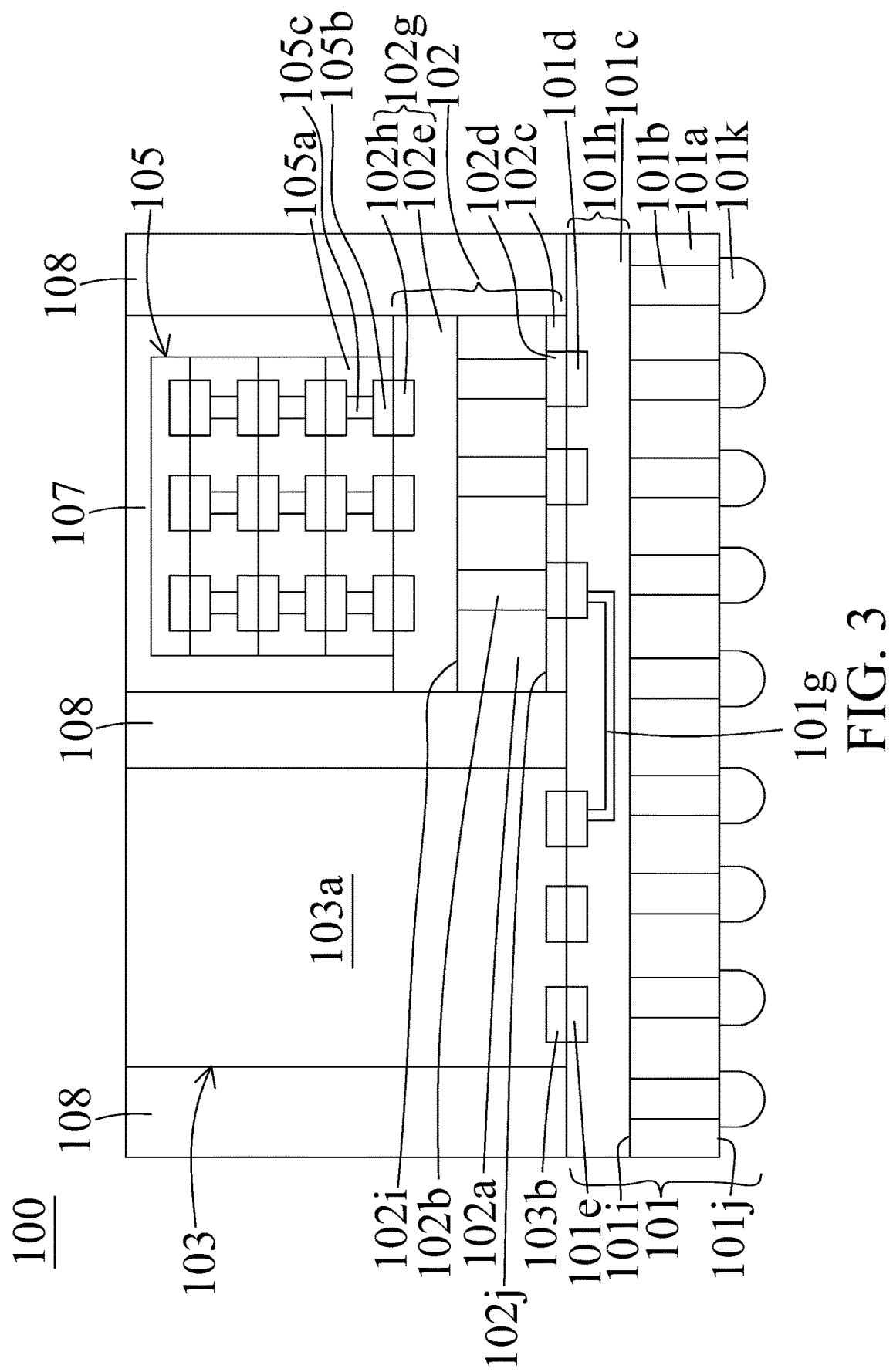
FIG. 3 is a cross-sectional view of the semiconductor package structure along a line B-B of FIG. 1.
Figure 4:
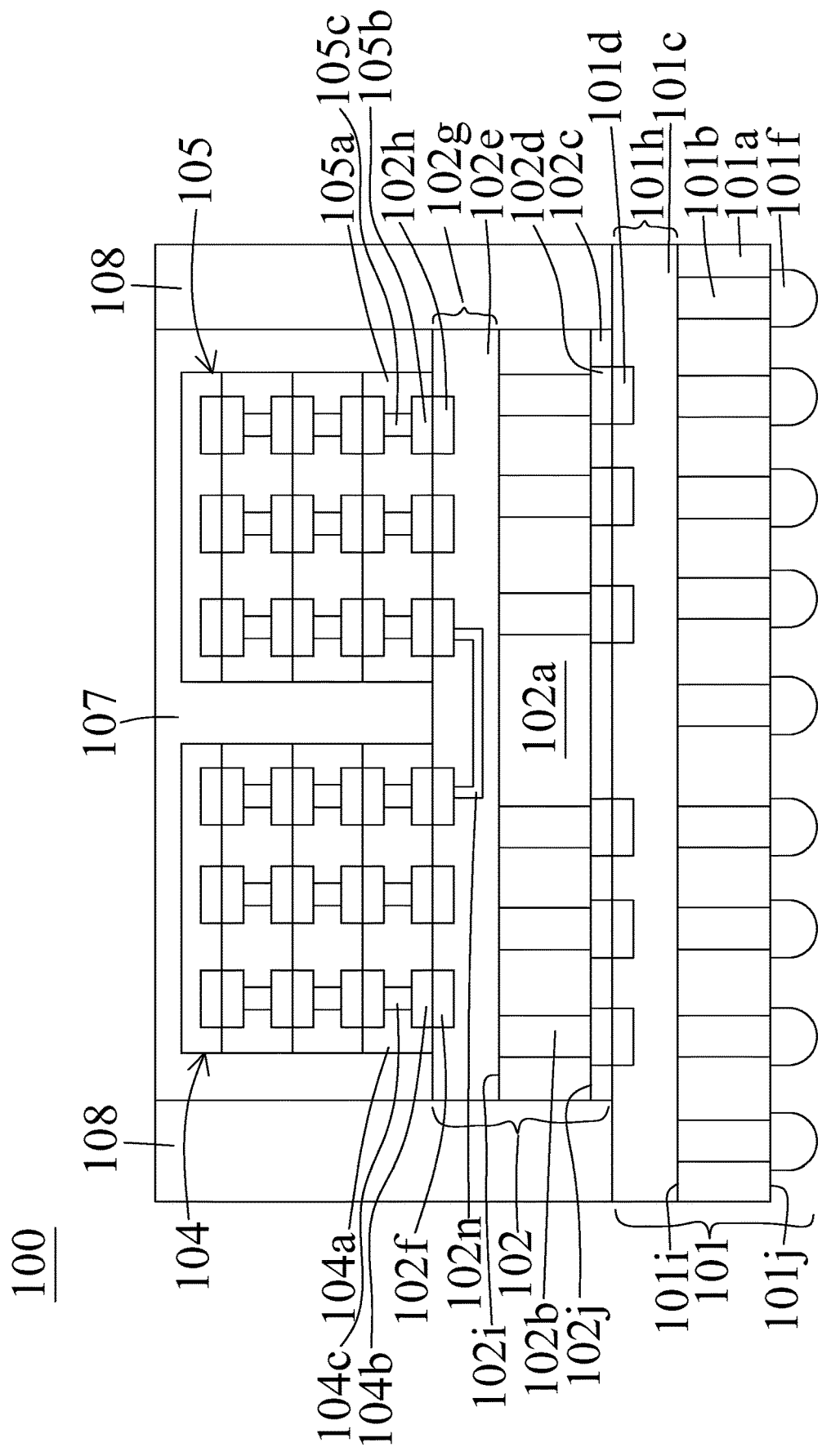
FIG. 4 is a cross-sectional view of the semiconductor package structure along a line C-C of FIG. 1.

FIG. 1 is a schematic top view of a semiconductor package structure 100 in accordance with some embodiments of the present disclosure. FIG. 2 is a schematic cross-sectional view of the semiconductor package structure 100 along a line A-A in FIG. 1. FIG. 3 is a schematic cross-sectional view of the semiconductor package structure 100 along a line B-B in FIG. 1. FIG. 4 is a schematic cross-sectional view of the semiconductor package structure 100 along a line C-C in FIG. 1.

In some embodiments, the semiconductor package structure 100 is a part of a package or a device. In some embodiments, the semiconductor package structure 100 includes several interposers and several dies disposed over the interposers. In some embodiments, the semiconductor package structure 100 is a bonded structure. In some embodiments, the semiconductor package structure 100 includes a first interposer 101, a second interposer 102, a first die 103, a second die 104, a first molding 107 and a second molding 108.

Referring to FIGS. 1 and 2, the first interposer 101 is configured as an intermediate substrate to electrically connect several dies disposed thereon. In some embodiments, the first interposer 101 is an inactive interposer; that is, none of a control circuit area is defined over the first interposer 101 or none of a control circuit is present over the first interposer 101. The first interposer 101 does not include any controller in or over the first interposer 101.

In some embodiments, the first interposer 101 includes a first substrate 101a and a first interconnect layer 101h over the first substrate 101a. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate. In some embodiments, a top surface of the first substrate 101a has a rectangular or polygonal shape or any other suitable shape.

In some embodiments, the first substrate 101a is defined with a first surface 101i and a second surface 101j opposite to the first surface 101i. In some embodiments, the first interconnect layer 101h is disposed on the first surface 101i of the first substrate 101a.

In some embodiments, a first via 101b is disposed within the first substrate 101a. In some embodiments, the first via 101b extends between the first surface 101i and the second surface 101j of the first substrate 101a. In some embodiments, the first via 101b is a through substrate via (TSV). In some embodiments, the first via 101b includes conductive material such as gold, silver, copper, nickel, tungsten, aluminum, tin, alloys thereof or the like. In some embodiments, a cross section of the first via 101b has a circular or polygonal shape. In some embodiments, the first via 101b has a cylindrical shape. In some embodiments, the first via 101b is electrically connected to the first interconnect layer 101h.

In some embodiments, the first interconnect layer 101h is disposed over the first surface 101i of the first substrate 101a. In some embodiments, the first interconnect layer 101h is configured to electrically connect several dies disposed over the first interposer 101 and electrically connect the dies to an external circuitry. In some embodiments, the first interconnect layer 101h includes a first bonding layer 101c, a first bonding pad 101d, a third bonding pad 101e and a first communication member 101f.

In some embodiments, the first bonding layer 101c is disposed over the first surface 101i of the first substrate 101a. In some embodiments, the first bonding layer 101c is configured to bond to another dielectric layer. In some embodiments, the first bonding layer 101c includes dielectric materials, such as silicon oxide, silicon oxynitride, silicon nitride or the like.

In some embodiments, the first bonding pad 101d is disposed over the first bonding layer 101c. In some embodiments, the first bonding pad 101d is surrounded by the first bonding layer 101c. In some embodiments, the first bonding pad 101d is at least partially exposed through the first bonding layer 101c.

In some embodiments, the first bonding pad 101d is configured to bond to another conductive member. In some embodiments, the first bonding pad 101d includes conductive material such as gold, silver, copper, nickel, tungsten, aluminum, tin, alloys thereof or the like. In some embodiments, a cross section of the first bonding pad 101d has a circular or polygonal shape.

In some embodiments, the third bonding pad 101e is disposed over the first bonding layer 101c. In some embodiments, the third bonding pad 101e is surrounded by the first bonding layer 101c. In some embodiments, the third bonding pad 101e is at least partially exposed through the first bonding layer 101c.

In some embodiments, the third bonding pad 101e is configured to bond to another conductive member. In some embodiments, the third bonding pad 101e includes conductive material such as gold, silver, copper, nickel, tungsten, aluminum, tin, alloys thereof or the like. In some embodiments, a cross section of the third bonding pad 101e has a circular or polygonal shape. In some embodiments, the third bonding pad 101e is similar to the first bonding pad 101d.

In some embodiments, the first communication member 101f is disposed within the first bonding layer 101c. In some embodiments, the first communication member 101f is electrically coupled to the first bonding pad 101d and the third bonding pad 101e. The first bonding pad 101d is electrically connected to the third bonding pad 101e via the first communication member 101f. In some embodiments, the first communication member 101f is an electrical routing within the first bonding layer 101c. In some embodiments, the first communication member 101f includes conductive material such as gold, silver, copper, nickel, tungsten, aluminum, tin, alloys thereof or the like.

In some embodiments, the second interposer 102 is disposed over the first interposer 101. In some embodiments, the second interposer 102 is disposed over the first interconnect layer 101h of the first interposer 101. In some embodiments, the second interposer 102 is disposed over the first bonding layer 101c of the first interconnect layer 101h.

In some embodiments, the second interposer 102 is configured as an intermediate substrate to electrically connect several dies disposed thereon. In some embodiments, the second interposer 102 is an active interposer; that is, a control circuit area is defined over the second interposer 102 or a control circuit is present over the second interposer 102. The second interposer 102 includes several controllers in or over the second interposer 102.

In some embodiments, the second interposer 102 includes a first control area 102k and a second control area 102m adjacent to the first control area 102k. In some embodiments, several controllers are disposed in the first control area 102k or the second control area 102m. In some embodiments, a memory die is disposed in the first control area 102k or the second control area 102m, wherein the memory die is controlled by a corresponding controller in the first control area 102k or the second control area 102m.

In some embodiments, the second interposer 102 includes a second substrate 102a and a second interconnect layer 102g over the second substrate 102a. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate. In some embodiments, a top surface of the second substrate 102a has a rectangular or polygonal shape or any other suitable shape.

In some embodiments, the second substrate 102a is defined with a third surface 102i and a fourth surface 102j opposite to the third surface 102i. In some embodiments, the second interconnect layer 102g is disposed on the third surface 102i of the second substrate 102a. In some embodiments, the second substrate 102a includes various features formed therein or thereover. In some embodiments, the second substrate 102a includes a variety of electrical circuits suitable for a particular application. In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the second substrate 102a and configured to electrically connect to an external circuitry.

In some embodiments, a second via 102b is disposed within the second substrate 102a. In some embodiments, the second via 102b extends between the third surface 102i and the fourth surface 102j of the second substrate 102a. In some embodiments, the second via 102b is a through substrate via (TSV). In some embodiments, the second via 102b includes conductive material such as gold, silver, copper, nickel, tungsten, aluminum, tin, alloys thereof or the like. In some embodiments, a cross section of the second via 102b has a circular or polygonal shape. In some embodiments, the second via 102b has a cylindrical shape. In some embodiments, the second via 102b is electrically connected to the second interconnect layer 102g. In some embodiments, the second via 102b is similar to the first via 101b.

In some embodiments, the second interconnect layer 102g is disposed over the third surface 102i of the second substrate 102a. In some embodiments, the second interconnect layer 102g is configured to electrically connect several dies disposed over the second interposer 102 and electrically connect the dies to an external circuitry. In some embodiments, the second interconnect layer 102g includes a dielectric layer 102e and a fourth bonding pad 102f.

In some embodiments, the dielectric layer 102e is disposed over the third surface 102i of the second substrate 102a. In some embodiments, the dielectric layer 102e is configured to bond to a die. In some embodiments, the dielectric layer 102e includes dielectric materials, such as silicon oxide, silicon oxynitride, silicon nitride or the like.

In some embodiments, the fourth bonding pad 102f is disposed over the dielectric layer 102e. In some embodiments, the fourth bonding pad 102f is surrounded by the dielectric layer 102e. In some embodiments, the fourth bonding pad 102f is at least partially exposed through the dielectric layer 102e. In some embodiments, the fourth bonding pad 102f is configured to bond to another conductive member. In some embodiments, the fourth bonding pad 102f includes conductive material such as gold, silver, copper, nickel, tungsten, aluminum, tin, alloys thereof or the like. In some embodiments, a cross section of the fourth bonding pad 102f has a circular or polygonal shape. In some embodiments, the fourth bonding pad 102f is similar to the third bonding pad 101e.

In some embodiments, the second interposer 102 includes a second bonding layer 102c and a second bonding pad 102d. In some embodiments, the second bonding layer 102c is disposed over the first interconnect layer 101h. In some embodiments, the second bonding layer 102c is disposed under the second substrate 102a. In some embodiments, the second bonding layer 102c is configured to bond to another dielectric layer. In some embodiments, the second bonding layer 102c includes dielectric materials, such as silicon oxide, silicon oxynitride, silicon nitride or the like. In some embodiments, the second bonding layer 102c of the second interposer 102 is bonded to the first bonding layer 101c of the first interposer 101 to form a dielectric-to-dielectric bonding.

In some embodiments, the second bonding pad 102d is surrounded by the second bonding layer 102c. In some embodiments, the second bonding pad 102d is at least partially exposed through the second bonding layer 102c. In some embodiments, the second bonding pad 102d is configured to bond to another conductive member. In some embodiments, the second bonding pad 102d includes conductive material such as gold, silver, copper, nickel, tungsten, aluminum, tin, alloys thereof or the like. In some embodiments, a cross section of the second bonding pad 102d has a circular or polygonal shape.

In some embodiments, the second bonding pad 102d is bonded to the first bonding pad 101d to form a metal-to-metal bonding. In some embodiments, the second bonding pad 102d is vertically aligned with the first bonding pad 101d. In some embodiments, the bonding of the first bonding pad 101d to the second bonding pad 102d and the bonding of the first bonding layer 101c to the dielectric layer 102e form a hybrid bonding. In some embodiments, the third bonding pad 101e is electrically connected to the second via 102b via the first bonding pad 101d, the second bonding pad 102d and the first communication member 101f.

In some embodiments, the first die 103 is disposed over the first interposer 101. In some embodiments, the first die 103 is disposed over the first bonding layer 101c. In some embodiments, the first die 103 is disposed adjacent to the second interposer 102. In some embodiments, the first die 103 is a logic die, a central processing unit (CPU) or the like. In some embodiments, the first die 103 includes a first die substrate 103a and a first die pad 103b.

In some embodiments, the first die pad 103b is disposed over the first die substrate 103a. In some embodiments, the first die substrate 103a includes various electrical circuits suitable for a particular application and various electrical devices or components connected by the electrical circuits. In some embodiments, the first die pad 103b is configured to electrically connect the circuits in the first die substrate 103a to an external conductive member. In some embodiments, the first die pad 103b includes conductive material such as gold, silver, copper, nickel, tungsten, aluminum, tin, alloys thereof or the like. In some embodiments, the first die pad 103b is an aluminum (Al) pad. In some embodiments, a top surface of the first die pad 103b has a circular or polygonal shape.

In some embodiments, the first die substrate 103a is bonded to the first bonding layer 101c, and the first die pad 103b is bonded to the third bonding pad 101e. In some embodiments, the first die pad 103b is vertically aligned with the third bonding pad 101e. In some embodiments, the bonding of the first die substrate 103a to the first bonding layer 101c and the bonding of the first die pad 103b to the third bonding pad 101e form a fusion bonding. In some embodiments, the first die 103 is electrically connected to the second interposer 102 via the first communication member 101f. In some embodiments, the first die 103 is electrically connected to the second via 102b through the first die pad 103b, the third bonding pad 101e, the first communication member 101f, the first bonding pad 101d and the second bonding pad 102d.

In some embodiments, the second die 104 is disposed over the second interposer 102. In some embodiments, the second substrate 102a is disposed between the second die 104 and the second interconnect layer 102g. In some embodiments, the second die 104 is disposed over the first control area 102k of the second interposer 102. The first control area 102k is under the second die 104. In some embodiments, the second die 104 is disposed over the dielectric layer 102e. In some embodiments, the second die 104 is a memory die or the like. In some embodiments, the second die 104 is a DRAM die. In some embodiments, the second die 104 includes a second die substrate 104a, a second die pad 104b and a second die via 104c.

In some embodiments, the second die substrate 104a includes various electrical circuits suitable for a particular application and various electrical devices or components connected by the electrical circuits. In some embodiments, the second die pad 104b is configured to electrically connect the circuits in the second die substrate 104a to an external conductive member. In some embodiments, the second die pad 104b includes conductive material such as gold, silver, copper, nickel, tungsten, aluminum, tin, alloys thereof or the like. In some embodiments, the second die pad 104b is an aluminum (Al) pad. In some embodiments, a top surface of the second die pad 104b has a circular or polygonal shape.

In some embodiments, the second die substrate 104a is bonded to the dielectric layer 102e, and the second die pad 104b is bonded to the fourth bonding pad 102f. In some embodiments, the second die pad 104b is vertically aligned with the fourth bonding pad 102f. In some embodiments, the second die 104 is electrically connected to the second interposer 102 via the second die pad 104b and the second interconnect layer 102g.

In some embodiments, the second die 104 includes several die substrates stacked over the second die substrate 104a. In some embodiments, the second die 104 includes several die pads stacked over and bonded to each other to electrically connect the die substrates. In some embodiments, the second die via 104c is disposed within the second die substrate 104a and electrically connected to the second die pad 104b with the die pads of the die substrates stacked above the second die substrate 104a. In some embodiments, a thickness of the first die 103 is substantially equal to a total of a thickness of the second die 104 and a thickness of the second interposer 102.

In some embodiments, the first interconnect layer 101h includes the first communication member 101f electrically connecting the first die 103 to the second interposer 102 and the second die 104. In some embodiments, the first die 103 is electrically connected to the second die 104 via the first communication member 101f and the second via 102b.

In some embodiments, the first molding 107 is disposed over the second interposer 102 and surrounds the second die 104. In some embodiments, the first molding 107 covers the entire second die 104. In some embodiments the first molding 107 is in contact with the dielectric layer 102e. In some embodiments, the first molding 107 includes molding material such as molding compound, epoxy, or the like. In some embodiments, the first molding 107 is a single layer film or a composite stack.

In some embodiments, the second molding 108 is disposed over the first interposer 101 and surrounds the first die 103 and the first molding 107. In some embodiments, a top surface 103c of the first die 103 and a top surface 107a of the first molding 107 are exposed through the second molding 108. In some embodiments, the second molding 108 is in contact with the first bonding layer 101c. In some embodiments, the second molding 108 includes molding material such as molding compound, epoxy, or the like. In some embodiments, the second molding 108 is a single layer film or a composite stack. In some embodiments, the first communication member 101f is disposed under the second molding 108.

In some embodiments, the first interposer 101 further includes a conductive bump 101k disposed under the first substrate 101a and electrically coupled to the first via 101b. In some embodiments, the conductive bump 101k is disposed at the second surface 101j of the first substrate 101a. In some embodiments, the conductive bump 101k is electrically coupled to the first via 101b. In some embodiments, the conductive bump 101k is configured to connect the first interconnect layer 101h and the first via 101b to an external electrical component or interconnection.

In some embodiments, the conductive bump 101k includes low-temperature reflowable material. In some embodiments, the conductive bump 101k includes soldering material such as tin, lead, silver, copper, nickel, bismuth, or a combination thereof. In some embodiments, the conductive bump 101k includes conductive material such as gold, silver, copper, nickel, tungsten, aluminum, tin, alloys thereof or the like. In some embodiments, the conductive bump 101k is a ball grid array (BGA) ball, a controlled collapse chip connection (C4) bump, a microbump or the like.

Referring to FIG. 3, the semiconductor package structure 100 further includes a third die 105 disposed over the second interposer 102. In some embodiments, the third die 105 is disposed adjacent to the second die 104. In some embodiments, the third die 105 is surrounded by the first molding 107. In some embodiments, the third die 105 is similar to the second die 102. In some embodiments, the third die 105 is a memory die or the like. In some embodiments, the third die is a Flash die.

In some embodiments, the second substrate 102a is disposed between the third die 105 and the second interconnect layer 102g. In some embodiments, the second interconnect layer 102g includes a fifth bonding pad 102h at least partially exposed through the dielectric layer 102e. In some embodiments, the fifth bonding pad 102h is configured to bond to another conductive member. In some embodiments, the fifth bonding pad 102h includes conductive material such as gold, silver, copper, nickel, tungsten, aluminum, tin, alloys thereof or the like. In some embodiments, a cross section of the fifth bonding pad 102h has a circular or polygonal shape. In some embodiments, the fourth bonding layer 102e is similar to the fifth bonding pad 102h.

In some embodiments, the third die 105 is disposed over the second control area 102m of the second interposer 102. The second control area 102m is under the third die 105. In some embodiments, the third die 105 is disposed over the dielectric layer 102e. In some embodiments, the third die 105 includes a third die substrate 105a, a third die pad 105b and a third die via 105c.

In some embodiments, the third die substrate 105a includes various electrical circuits suitable for a particular application and various electrical devices or components connected by the electrical circuits. In some embodiments, the third die pad 105b is configured to electrically connect the circuits in the third die substrate 105a to an external conductive member. In some embodiments, the third die pad 105b includes conductive material such as gold, silver, copper, nickel, tungsten, aluminum, tin, alloys thereof or the like. In some embodiments, the third die pad 105b is an aluminum (Al) pad. In some embodiments, a top surface of the third die pad 105b has a circular or polygonal shape.

In some embodiments, the third die substrate 105a is bonded to the dielectric layer 102e, and the third die pad 105b is bonded to the fifth bonding pad 102h. In some embodiments, the third die pad 105b is vertically aligned with the fifth bonding pad 102h. In some embodiments, the third die 105 is electrically connected to the second interposer 102 via the third die pad 105b and the second interconnect layer 102g.

In some embodiments, the third die 105 includes several die substrates stacked over the third die substrate 105a. In some embodiments, the third die 105 includes several die pads stacked over and bonded to each other to electrically connect the die substrates. In some embodiments, the third die via 105c is disposed within the third die substrate 105a and electrically connected to the third die pad 105b with the die pads of the die substrates stacked above the third die substrate 105a. In some embodiments, the thickness of the first die 103 is substantially equal to a total of a thickness of the third die 105 and the thickness of the second interposer 102.

In some embodiments, the first interconnect layer 101h further includes a second communication member 101g within the first bonding layer 101c of the first interposer 101. In some embodiments, the second communication member 101g is electrically coupled to the first bonding pad 101d and the third bonding pad 101e. The first bonding pad 101d is electrically connected to the third bonding pad 101e via the second communication member 101g. In some embodiments, the second communication member 101g is an electrical routing within the first bonding layer 101c. In some embodiments, the second communication member 101g includes conductive material such as gold, silver, copper, nickel, tungsten, aluminum, tin, alloys thereof or the like. In some embodiments, the second communication member 101g is similar to the first communication member 101f.

In some embodiments, the second communication member 101g electrically connects the first die 103 to the second interposer 102 and the third die 105. In some embodiments, the first die 103 is electrically connected to the third die 105 via the second communication member 101g and the second via 102b. In some embodiments, the second communication member 101g is disposed under the second molding 108.

Referring to FIG. 4, the second interconnect layer 102g further includes a third communication member 102n within the dielectric layer 102e of the second interposer 102. In some embodiments, the third communication member 102n is electrically coupled to the fourth bonding pad 102f and the fifth bonding pad 102h. The fourth bonding pad 102f is electrically connected to the fifth bonding pad 102h via the third communication member 102n. In some embodiments, the second die 104 is electrically connected to the third die 105 via the third communication member 102n. In some embodiments, the second die 104 is electrically connected to the third die 105 through the third communication member 102n, the fourth bonding pad 102f and the fifth bonding pad 102h.

In some embodiments, the third communication member 102n is an electrical routing within the dielectric layer 102e. In some embodiments, the third communication member 102n includes conductive material such as gold, silver, copper, nickel, tungsten, aluminum, tin, alloys thereof or the like. In some embodiments, the third communication member 102n is disposed under the first molding 107.

Figure 5:
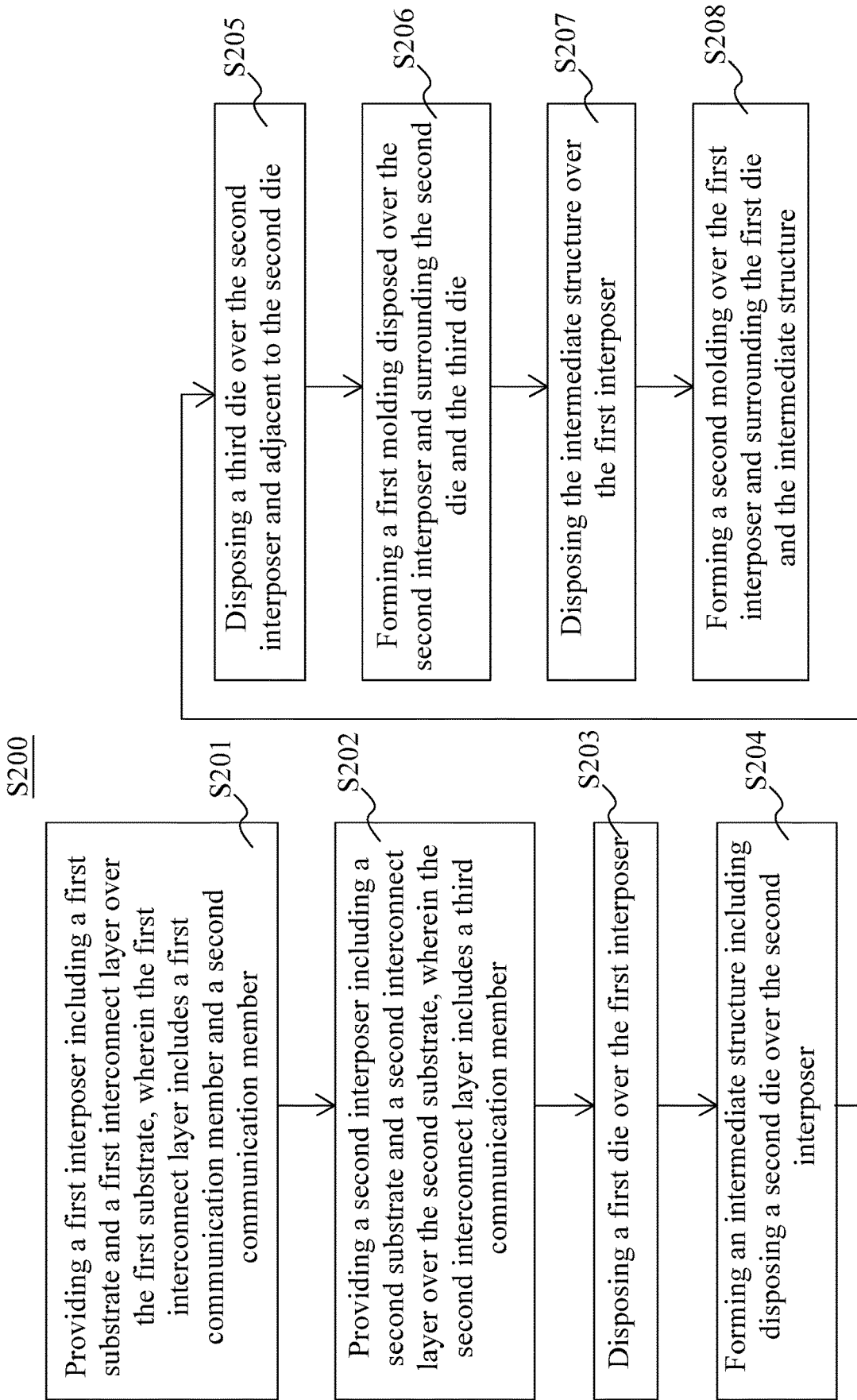
FIG. 5 is a flow diagram illustrating a method of manufacturing a semiconductor package structure in accordance with some embodiments of the present disclosure.

FIG. 5 is a flow diagram illustrating a method S200 of manufacturing the semiconductor package structure 100 in accordance with some embodiments of the present disclosure, and FIGS. 6 to 42 illustrate cross-sectional views of intermediate stages in the formation of the semiconductor package structure 100 in accordance with some embodiments of the present disclosure.

The stages shown in FIGS. 6 to 42 are also illustrated schematically in the flow diagram in FIG. 5. In the following discussion, the fabrication stages shown in FIGS. 6 to 42 are discussed in reference with the process steps shown in FIG. 5. The method S200 includes a number of operations and the description and illustration are not deemed as a limitation as the sequence of the operations.

The method S200 includes a number of steps (S201, S202, S203, S204, S205, S206, S207 and S208). The method S200 includes providing a first interposer including a first substrate and a first interconnect layer over the first substrate, wherein the first interconnect layer includes a first communication member and a second communication member (S201); providing a second interposer including a second substrate and a second interconnect layer over the second substrate, wherein the second interconnect layer includes a third communication member (S202); disposing a first die over the first interposer (S203); forming an intermediate structure including disposing a second die over the second interposer (S204); disposing a third die over the second interposer and adjacent to the second die (S205); forming a first molding disposed over the second interposer and surrounding the second die and the third die (S206); disposing the intermediate structure over the first interposer (S207); and forming a second molding over the first interposer and surrounding the first die and the intermediate structure (S208).

Figure 6:
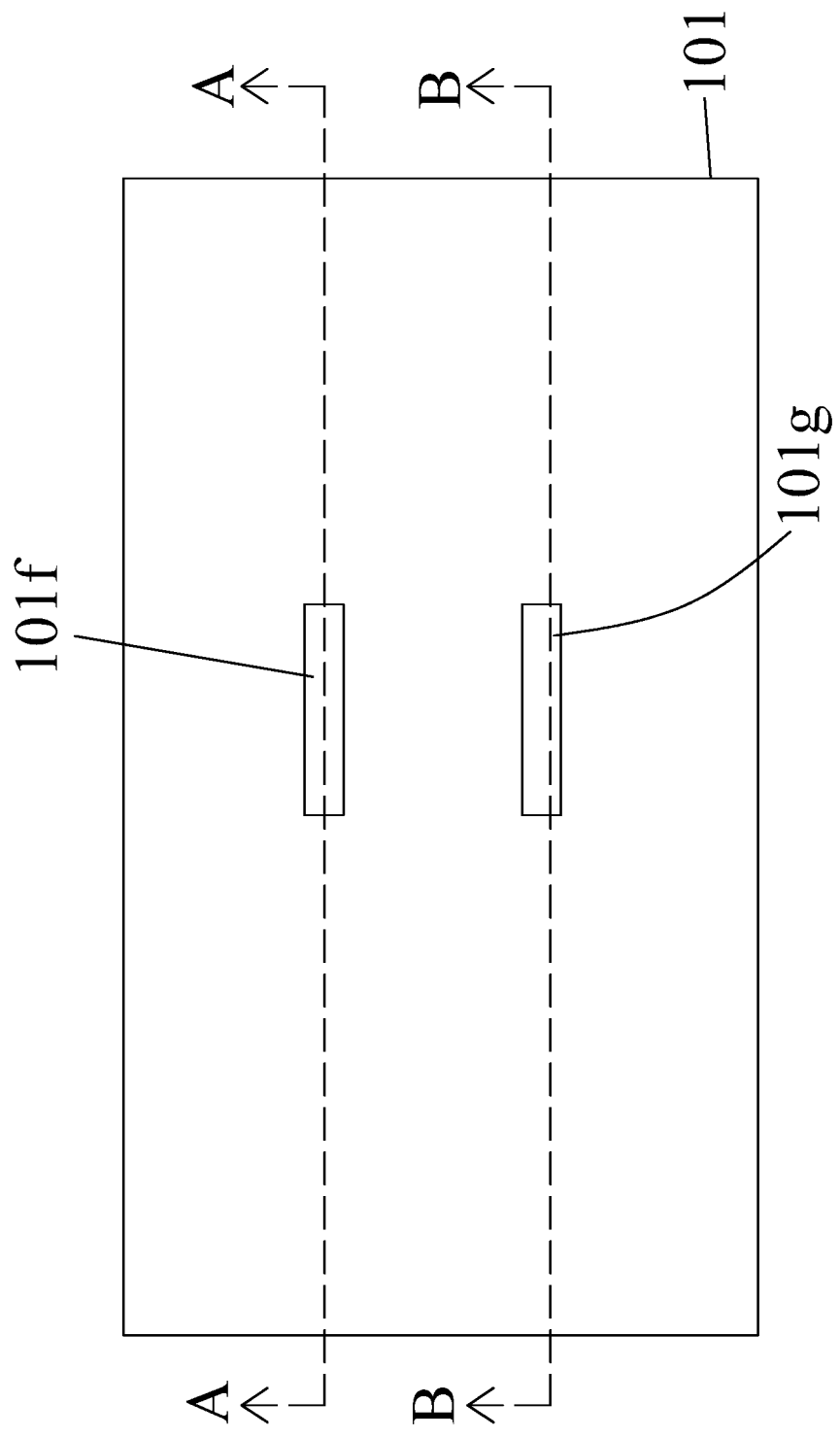
FIGS. 6 through 42 illustrate cross-sectional views of intermediate stages in the formation of a semiconductor package structure in accordance with some embodiments of the present disclosure.
Figure 7:
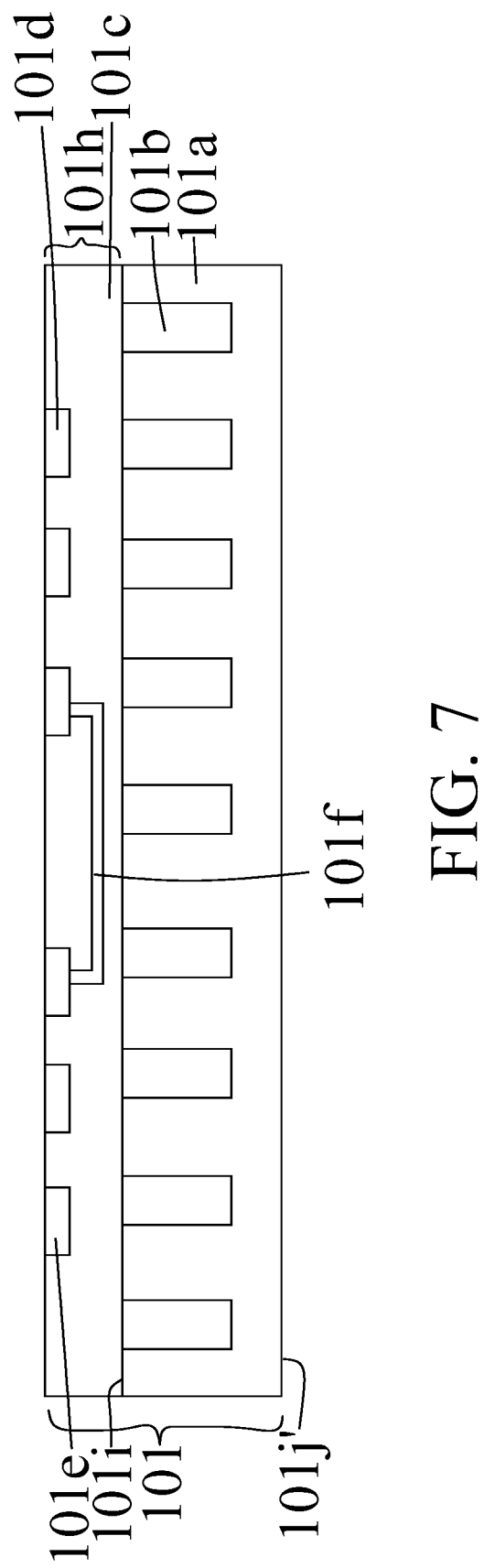
Figure 8:
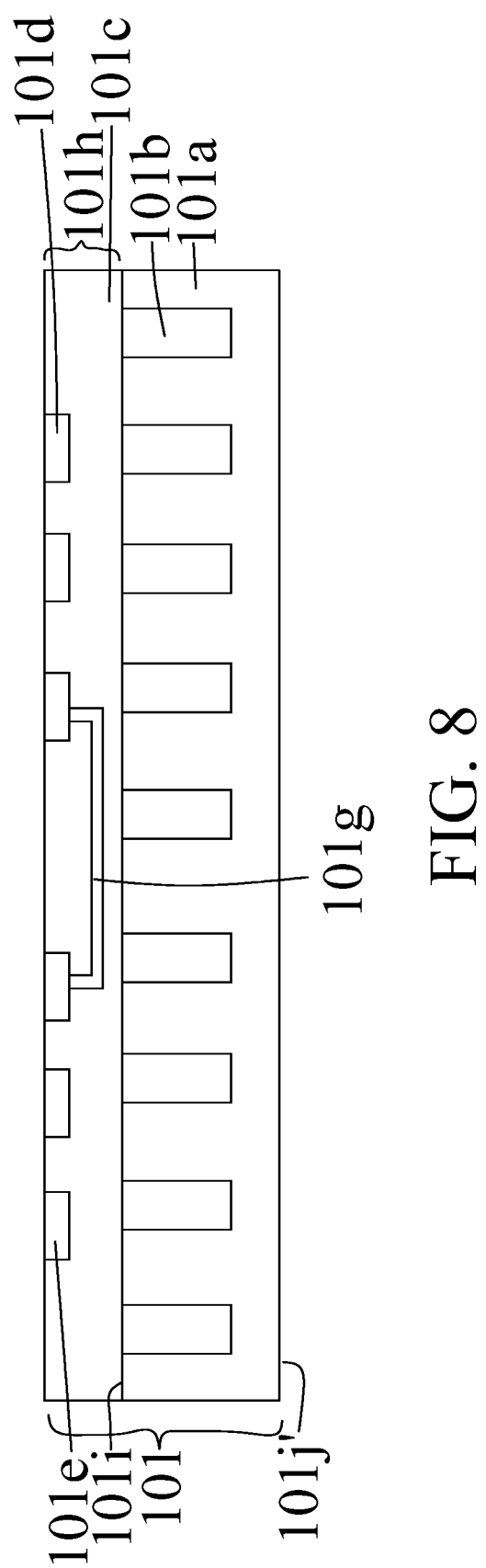

Referring to FIGS. 6 to 8, a first interposer 101 is provided according to step S201 in FIG. 5. FIG. 6 is a top view of the first interposer 101, FIG. 7 is a cross-sectional view of the first interposer 101 along a line A-A of FIG. 6, and FIG. 8 is a cross-sectional view of the first interposer 101 along a line B-B of FIG. 6. In some embodiments, the first interposer 101 has a configuration similar to that of the first interposer 101 illustrated in FIGS. 1 to 4 and discussed above.

In some embodiments, the first interposer 101 includes a first substrate 101a and a first interconnect layer 101h over the first substrate 101a. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

In some embodiments, the first substrate 101a is defined with a first surface 101i and an untreated second surface 101f opposite to the first surface 101i. In some embodiments, the first interconnect layer 101h is disposed on the first surface 101i of the first substrate 101a. In some embodiments, a first via 101b is disposed within the first substrate 101a. In some embodiments, the first via 101b extends into the first substrate 101a. In some embodiments, the first via 101b is a through substrate via (TSV). In some embodiments, the first via 101b includes conductive material such as gold, silver, copper, nickel, tungsten, aluminum, tin, alloys thereof or the like.

In some embodiments, the first interconnect layer 101h is disposed over the first surface 101i of the first substrate 101a. In some embodiments, the first interconnect layer 101h includes a first bonding layer 101c, a first bonding pad 101d, a third bonding pad 101e, a first communication member 101f and a second communication member 101g. In some embodiments, the first bonding layer 101c is disposed over the first surface 101i of the first substrate 101a. In some embodiments, the first bonding layer 101c includes dielectric materials, such as silicon oxide, silicon oxynitride, silicon nitride or the like.

In some embodiments, the first bonding pad 101d and the third bonding pad 101e are at least partially exposed through the first bonding layer 101c. In some embodiments, the first bonding pad 101d and the third bonding pad 101e include conductive material such as gold, silver, copper, nickel, tungsten, aluminum, tin, alloys thereof or the like.

In some embodiments, the first communication member 101f and the second communication member 101g are disposed within the first bonding layer 101c. In some embodiments, the first communication member 101f is electrically coupled to the first bonding pad 101d and the third bonding pad 101e. In some embodiments, the first communication member 101f includes conductive material such as gold, silver, copper, nickel, tungsten, aluminum, tin, alloys thereof or the like. In some embodiments, the second communication member 101g is electrically coupled to the first bonding pad 101d and the third bonding pad 101e. In some embodiments, the second communication member 101g includes conductive material such as gold, silver, copper, nickel, tungsten, aluminum, tin, alloys thereof or the like.

Figure 9:
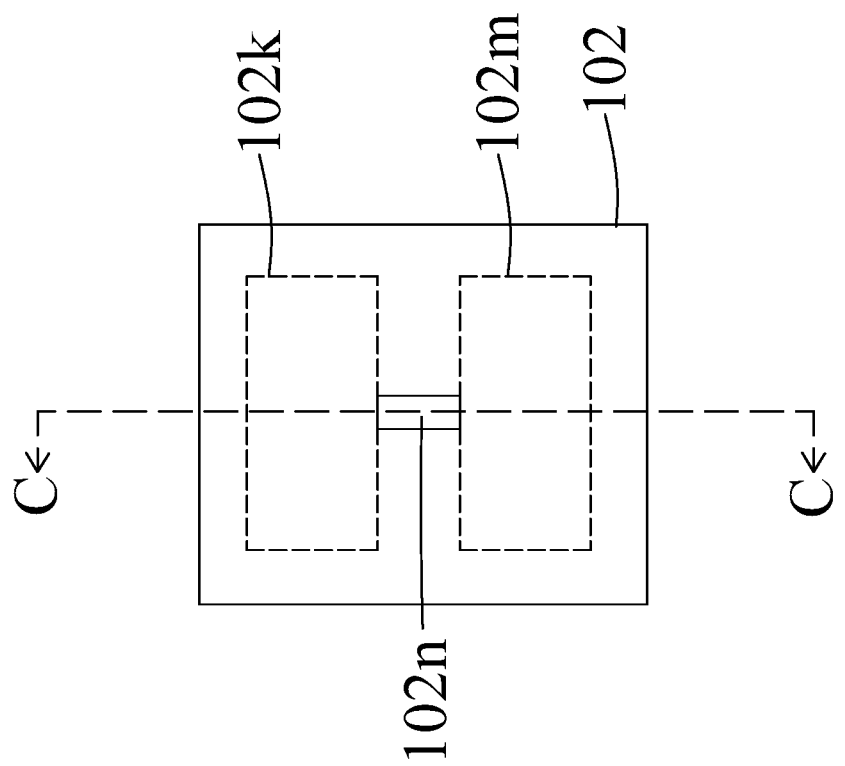
Figure 10:
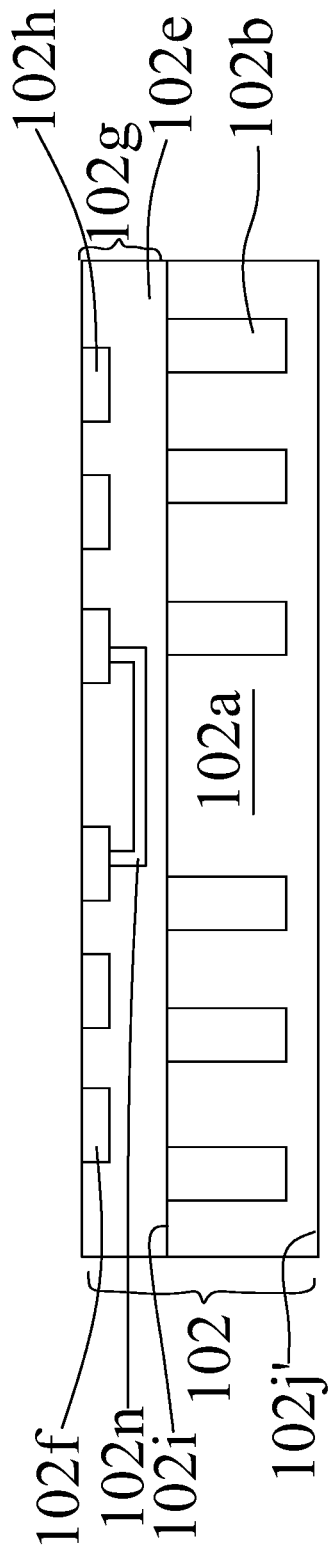

Referring to FIGS. 9 to 10, a second interposer 102 is provided according to step S202 in FIG. 5. FIG. 9 is a top view of the second interposer 102, and FIG. 10 is a cross-sectional view of the second interposer 102 along a line C-C of FIG. 9. In some embodiments, the second interposer 102 has a configuration similar to that of the second interposer 102 illustrated in FIGS. 1 to 4 and discussed above.

In some embodiments, the second interposer 102 includes a first control area 102k and a second control area 102m adjacent to the first control area 102k. In some embodiments, the second interposer 102 includes a second substrate 102a and a second interconnect layer 102g over the second substrate 102a. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate.

In some embodiments, the second substrate 102a is defined with a third surface 102i and an untreated fourth surface 102j opposite to the third surface 102i. In some embodiments, a second via 102b is disposed within the second substrate 102a. In some embodiments, the second via 102b extends into the second substrate 102a. In some embodiments, the second via 102b is a through substrate via (TSV). In some embodiments, the second via 102b includes conductive material such as gold, silver, copper, nickel, tungsten, aluminum, tin, alloys thereof or the like.

In some embodiments, the second interconnect layer 102g includes a dielectric layer 102e, a fourth bonding pad 102f and a fifth bonding pad 102h. In some embodiments, the dielectric layer 102e is disposed over the third surface 102i of the second substrate 102a. In some embodiments, the dielectric layer 102e is configured to bond to a die. In some embodiments, the dielectric layer 102e includes dielectric materials, such as silicon oxide, silicon oxynitride, silicon nitride or the like.

In some embodiments, the fourth bonding pad 102f is disposed over the dielectric layer 102e. In some embodiments, the fourth bonding pad 102f is surrounded by the dielectric layer 102e. In some embodiments, the fourth bonding pad 102f is at least partially exposed through the dielectric layer 102e. In some embodiments, the fourth bonding pad 102f includes conductive material such as gold, silver, copper, nickel, tungsten, aluminum, tin, alloys thereof or the like. In some embodiments, the fifth bonding pad 102h is at least partially exposed through the dielectric layer 102e. In some embodiments, the fifth bonding pad 102h includes conductive material such as gold, silver, copper, nickel, tungsten, aluminum, tin, alloys thereof or the like.

In some embodiments, the third communication member 102n is electrically coupled to the fourth bonding pad 102f and the fifth bonding pad 102h. In some embodiments, the third communication member 102n includes conductive material such as gold, silver, copper, nickel, tungsten, aluminum, tin, alloys thereof or the like.

Figure 11:
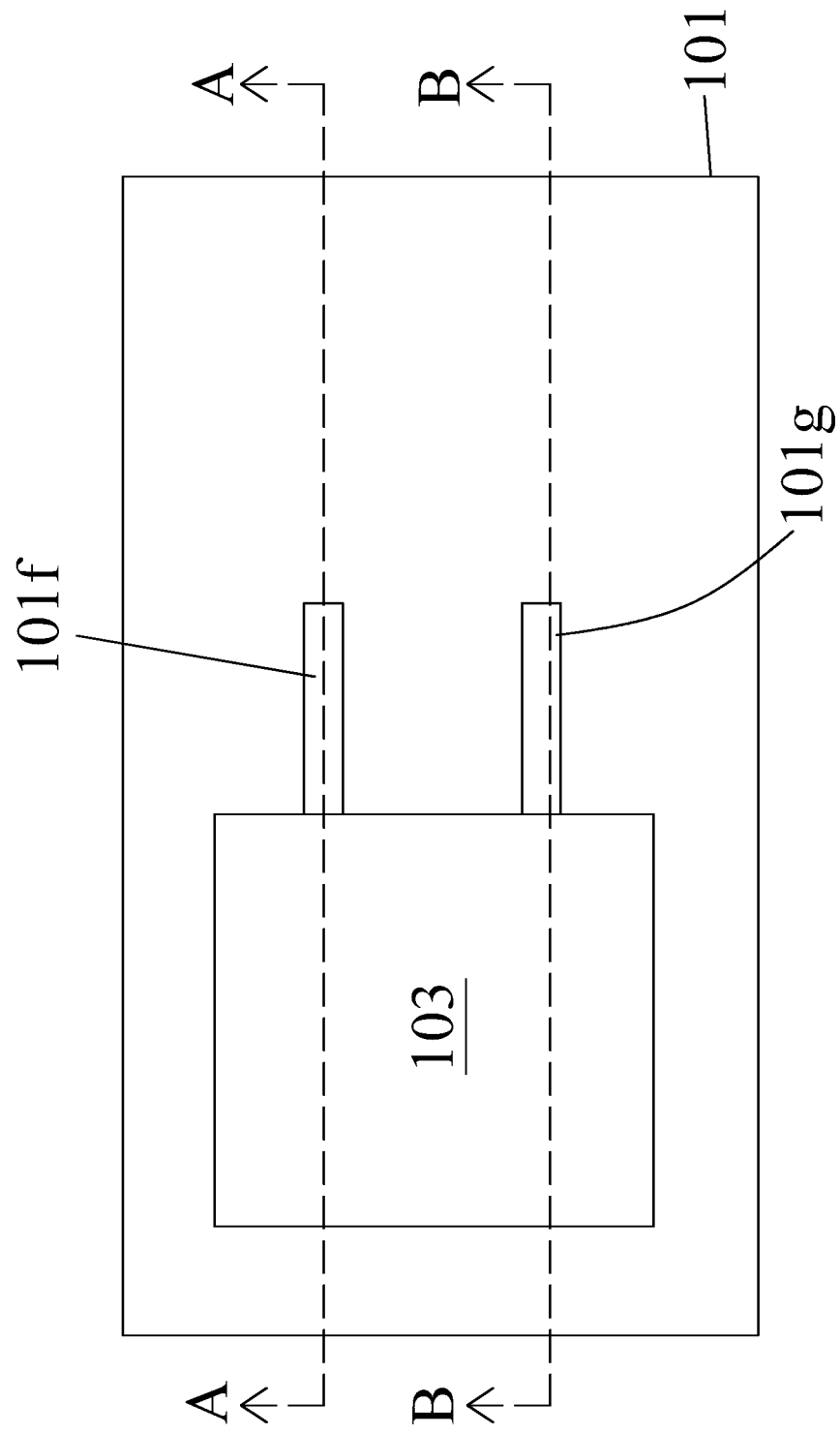
Figure 12:
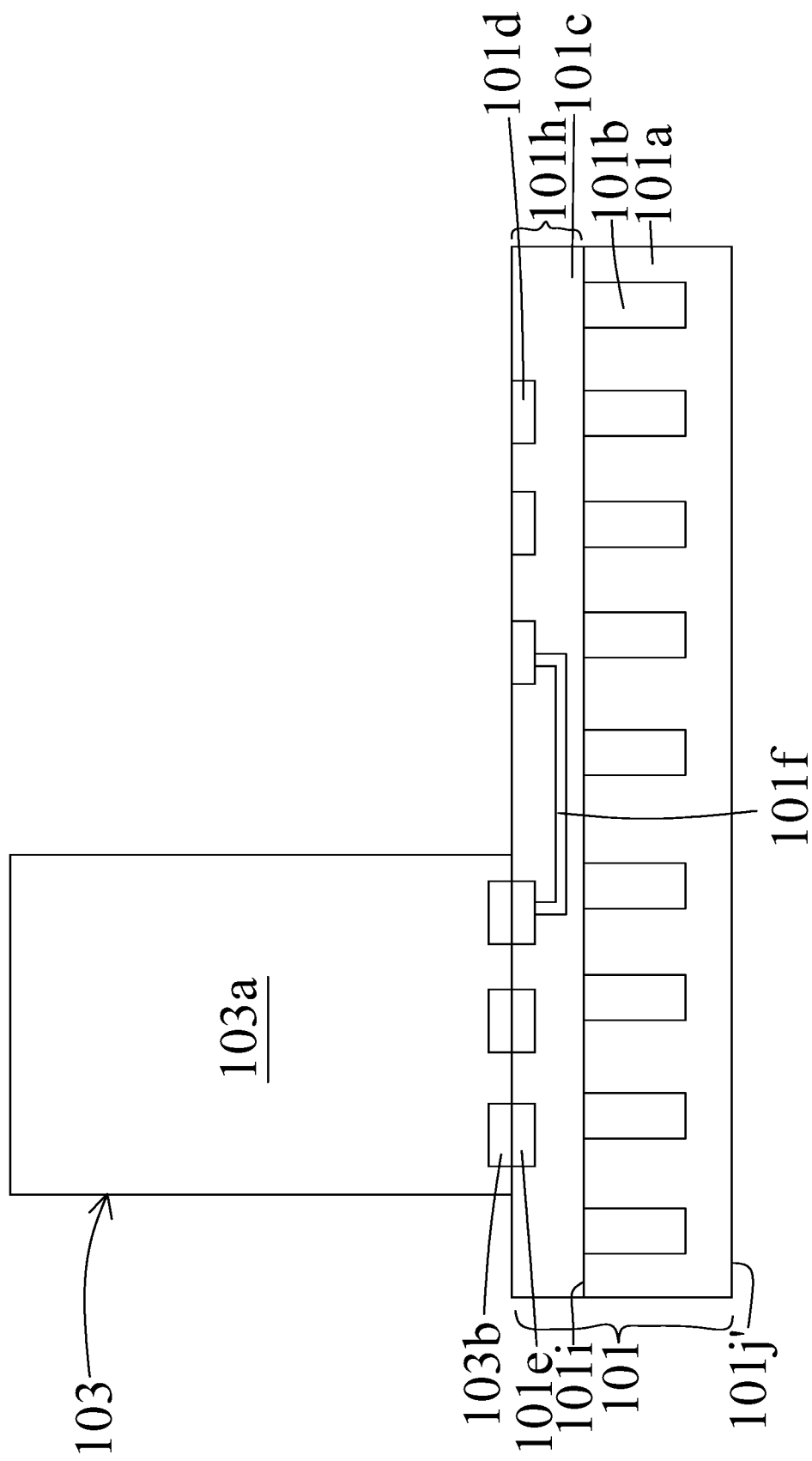
Figure 13:
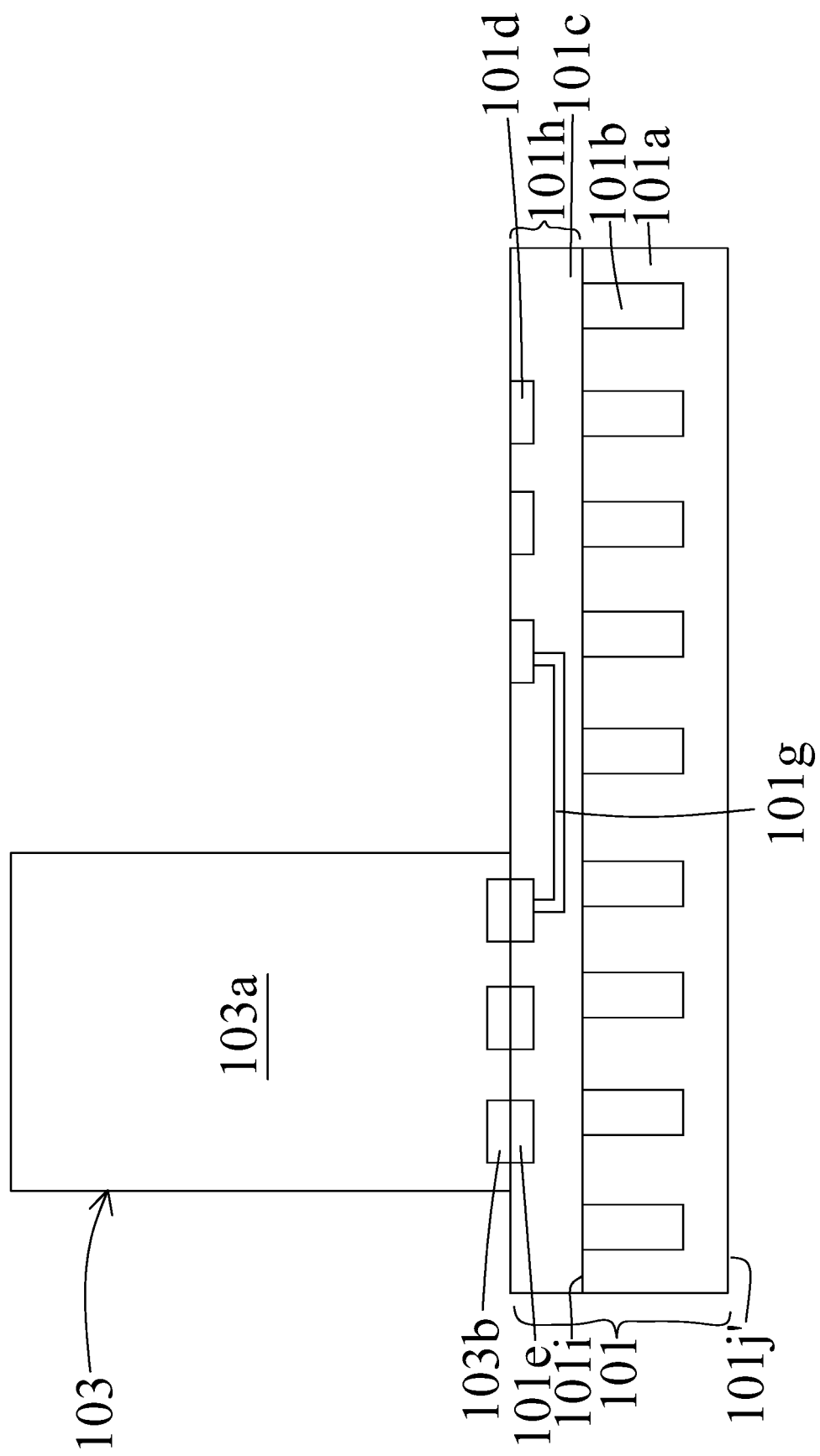

Referring to FIGS. 11 to 13, a first die 103 is disposed over the first interposer 101 according to step S203 in FIG. 5. FIG. 11 is a top view of the first die 103 and the first interposer 101, FIG. 12 is a cross-sectional view of the first die 103 and the first interposer 101 along a line A-A of FIG. 11, and FIG. 13 is a cross-sectional view of the first die 103 and the first interposer 101 along a line B-B of FIG. 11. In some embodiments, the first die 103 has a configuration similar to that of the first die 103 illustrated in FIGS. 1 to 4 and discussed above.

In some embodiments, the first die 103 is disposed over the first bonding layer 101c. In some embodiments, the first die 103 is disposed over the first interposer 101 by hybrid bonding. In some embodiments, the first die 103 is a logic die, a central processing unit (CPU) or the like. In some embodiments, the first die 103 includes a first die substrate 103a and a first die pad 103b.

In some embodiments, the first die pad 103b is disposed over the first die substrate 103a. In some embodiments, the first die 103 is disposed over the first interposer 101 by bonding the first die pad 103b to the third bonding pad 101e. In some embodiments, the first die pad 103b includes conductive material such as gold, silver, copper, nickel, tungsten, aluminum, tin, alloys thereof or the like. In some embodiments, the first die pad 103b is an aluminum (Al) pad. In some embodiments, the first die substrate 103a is bonded to the first bonding layer 101c, and the first die pad 103b is bonded to the third bonding pad 101e. In some embodiments, the first die pad 103b is vertically aligned with the third bonding pad 101e. In some embodiments, the bonding of the first die substrate 103a to the first bonding layer 101c and the bonding of the first die pad 103b to the third bonding pad 101e form a fusion bonding between the first die 103 and the first interposer 101.

Referring to FIGS. 14 to 27, an intermediate structure 300 is formed. In some embodiments, the formation of the intermediate structure includes disposing a second die 104 over the second interposer 102, disposing a third die 105 over the second interposer 102, and forming a first molding 107 disposed over the second interposer 102 and surrounding the second die 104 and the third die 105. In some embodiments, the intermediate structure 300 is formed before or after the disposing of the first die 103.

Figure 14:
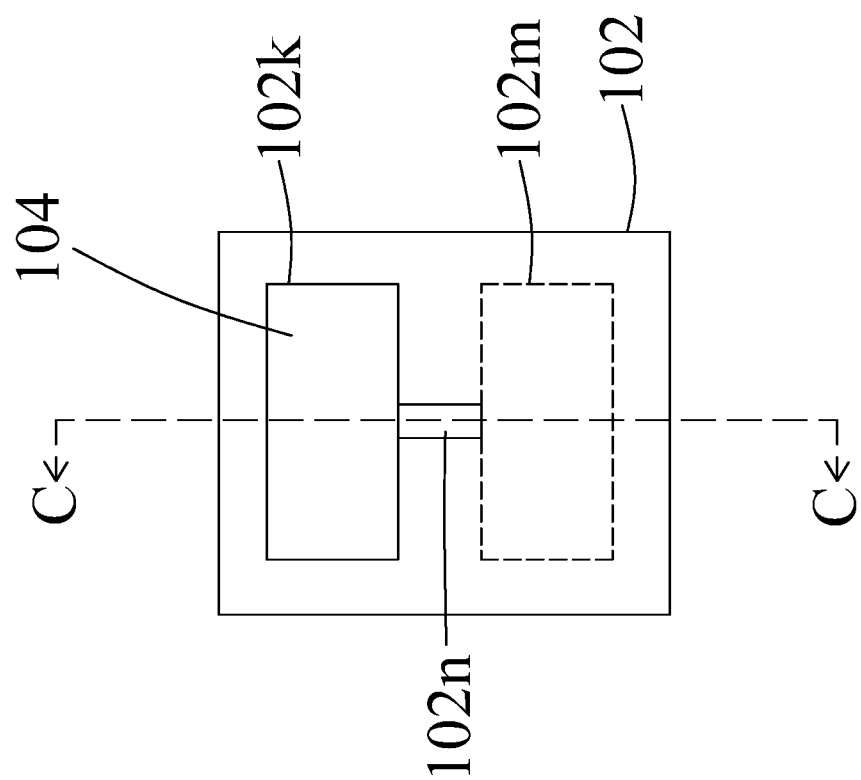
Figure 15:
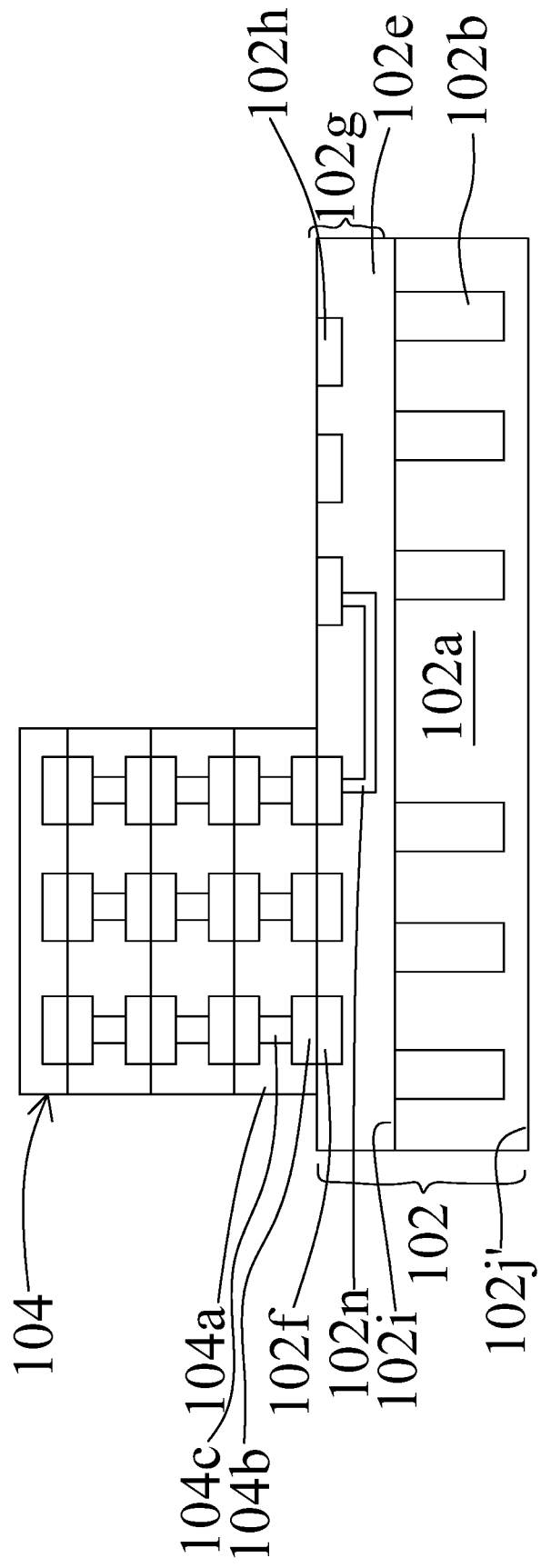

Referring to FIGS. 14 to 15, the second die 104 is disposed over the second interposer 102 according to step S204 in FIG. 5. FIG. 14 is a top view of the second die 104 and the second interposer 102, and FIG. 15 is a cross-sectional view of the second die 104 and the second interposer 102 along a line C-C of FIG. 14. In some embodiments, the second die 104 has a configuration similar to that of the second die 104 illustrated in FIGS. 1 to 4 and discussed above.

In some embodiments, the second die 104 is disposed over the first control area 102k of the second interposer 102. In some embodiments, the second die 104 is disposed over the dielectric layer 102e. In some embodiments, the second die 104 is a memory die or the like. In some embodiments, the second die 104 is a DRAM die. In some embodiments, the second die 104 includes a second die substrate 104a, a second die pad 104b and a second die via 104c.

In some embodiments, the second die substrate 104a includes various electrical circuits suitable for a particular application and various electrical devices or components connected by the electrical circuits. In some embodiments, the second die pad 104b is configured to electrically connect the circuits in the second die substrate 104a to an external conductive member. In some embodiments, the second die pad 104b includes conductive material such as gold, silver, copper, nickel, tungsten, aluminum, tin, alloys thereof or the like. In some embodiments, the second die pad 104b is an aluminum (Al) pad.

In some embodiments, the second die substrate 104a is bonded to the dielectric layer 102e, and the second die pad 104b is bonded to the fourth bonding pad 102f. In some embodiments, the second die pad 104b is vertically aligned with the fourth bonding pad 102f.

Figure 16:
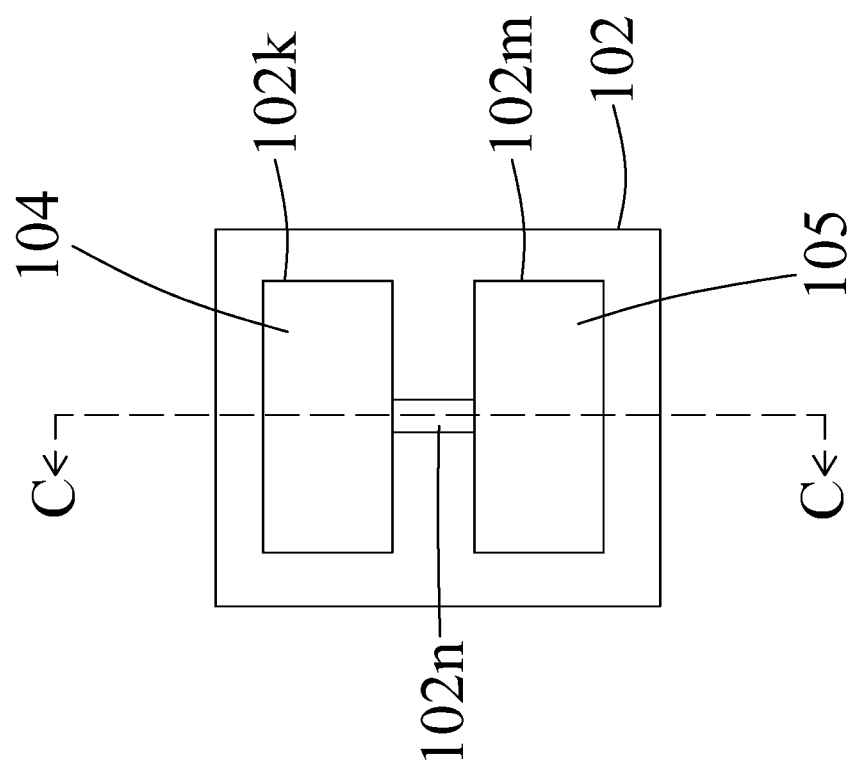
Figure 17:
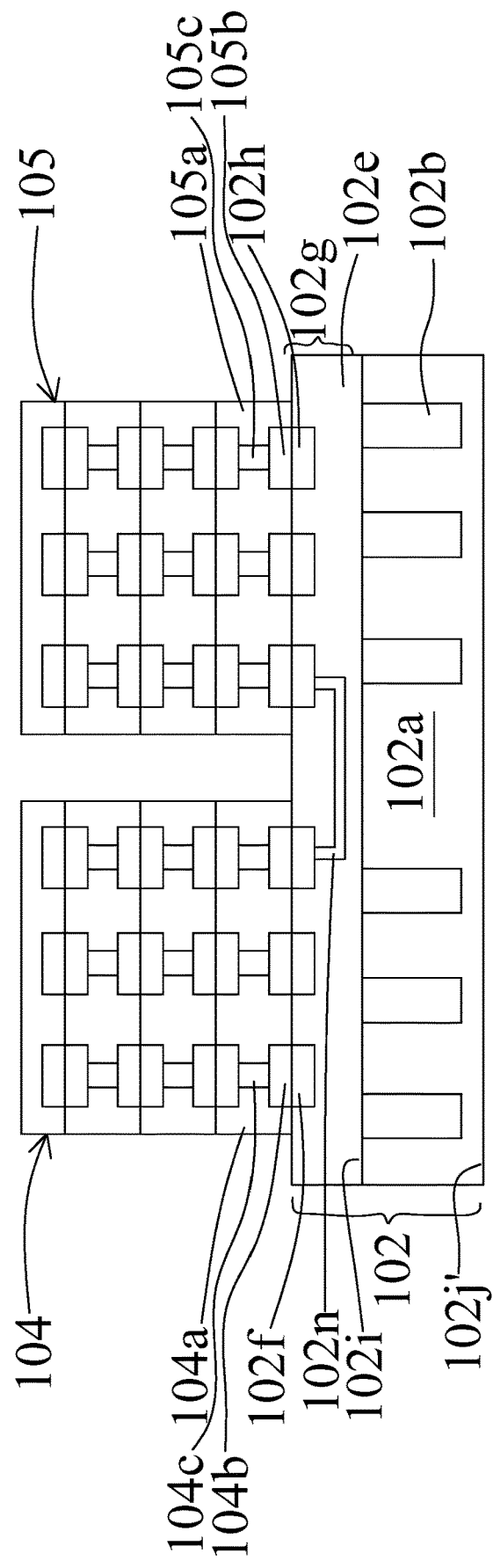

Referring to FIGS. 16 to 17, the third die 105 is disposed over the second interposer 102 and adjacent to the second die 104 according to step S205 in FIG. 5. FIG. 16 is a top view of the third die 105, the second die 104 and the second interposer 102, and FIG. 17 is a cross-sectional view of the third die 105, the second die 104 and the second interposer 102 along a line C-C of FIG. 16. In some embodiments, the third die 105 has a configuration similar to that of the third die 105 illustrated in FIGS. 1 to 4 and discussed above.

In some embodiments, the third die 105 is disposed over the second control area 102m of the second interposer 102. In some embodiments, the third die 105 is disposed over the dielectric layer 102e. In some embodiments, the third die 105 includes a third die substrate 105a, a third die pad 105b and a third die via 105c.

In some embodiments, the third die substrate 105a includes various electrical circuits suitable for a particular application and various electrical devices or components connected by the electrical circuits. In some embodiments, the third die pad 105b is configured to electrically connect the circuits in the third die substrate 105a to an external conductive member. In some embodiments, the third die pad 105b includes conductive material such as gold, silver, copper, nickel, tungsten, aluminum, tin, alloys thereof or the like. In some embodiments, the third die pad 105b is an aluminum (Al) pad.

In some embodiments, the third die substrate 105a is bonded to the dielectric layer 102e, and the third die pad 105b is bonded to the fifth bonding pad 102h. In some embodiments, the third die pad 105b is vertically aligned with the fifth bonding pad 102h. In some embodiments, the third die 105 is electrically connected to the second die 104 via the second interconnect layer 102g of the second interposer 102.

Figure 18:
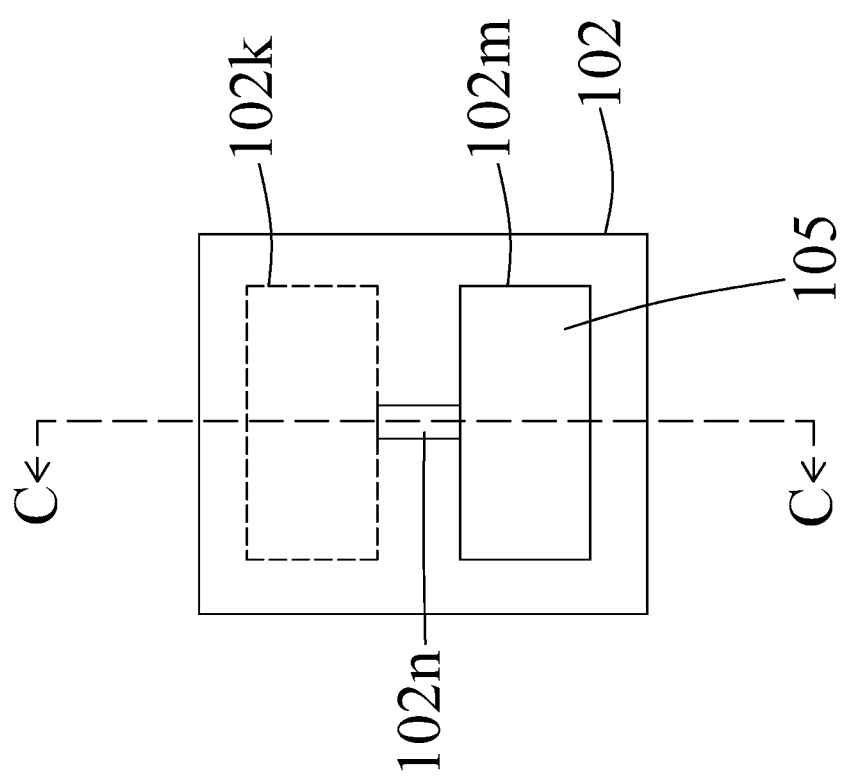
Figure 19:
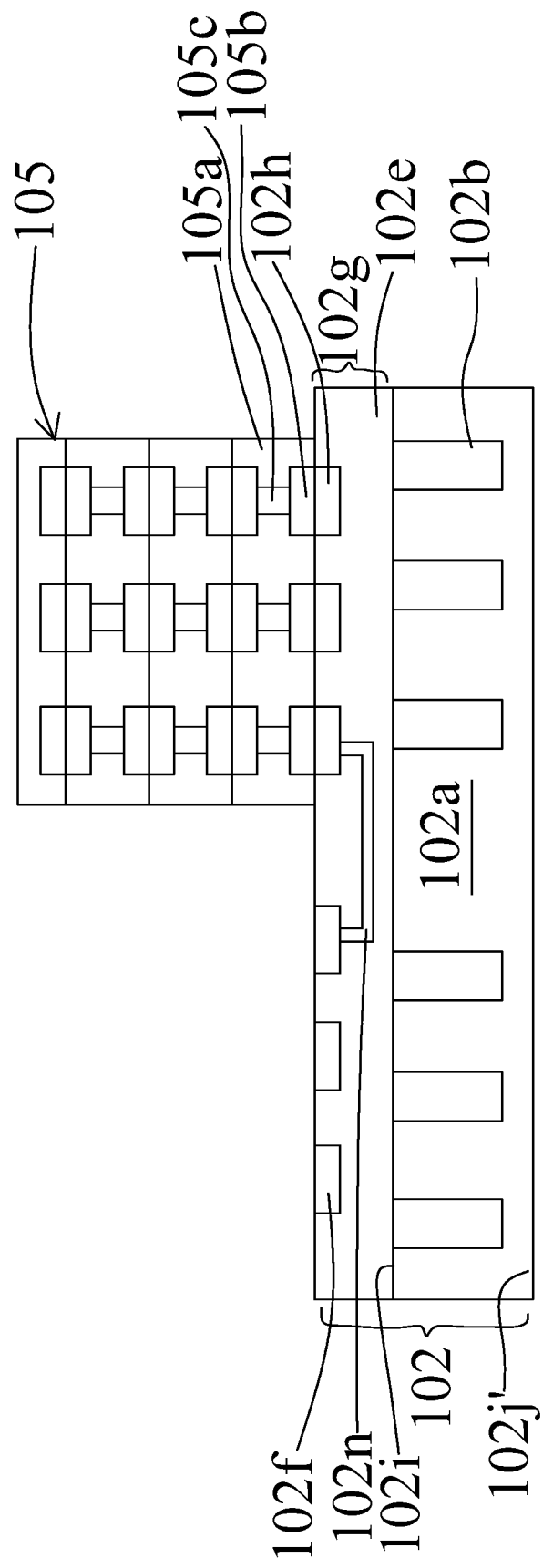

Alternatively, in some embodiments, the disposing of the third die 105 (S205) is implemented prior to the disposing of the second die 104 (S204) as shown in FIGS. 18 to 19. In some embodiments, the third die 105 is disposed as shown in FIGS. 18 to 19, and then the second die 104 is disposed as shown in FIGS. 16 to 17.

Figure 20:
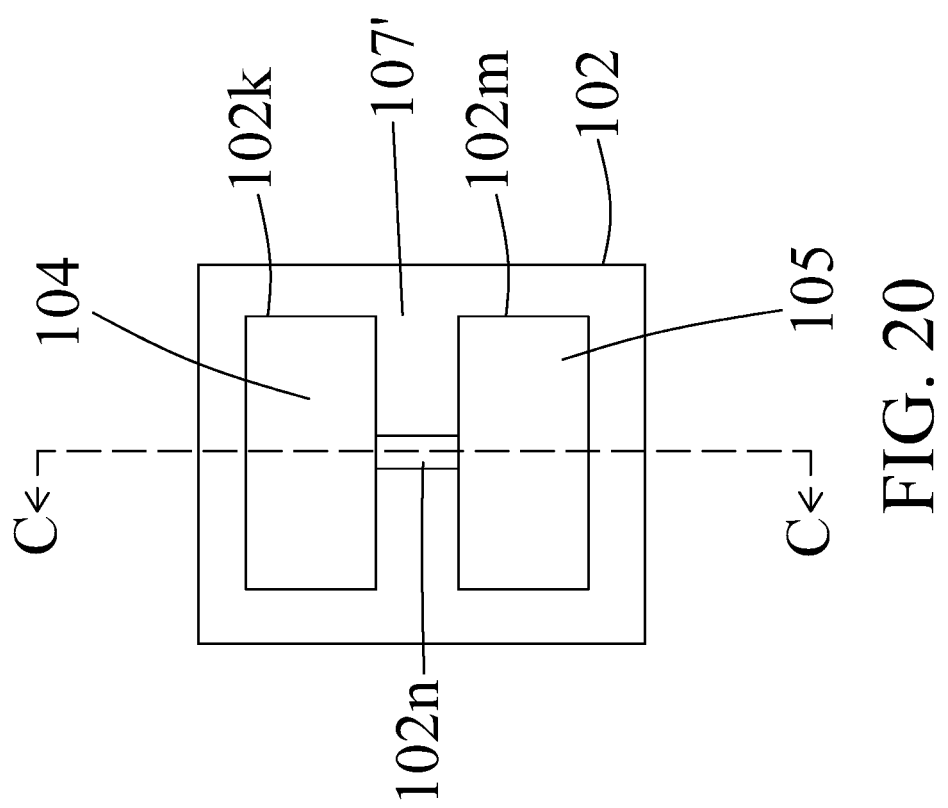
Figure 21:
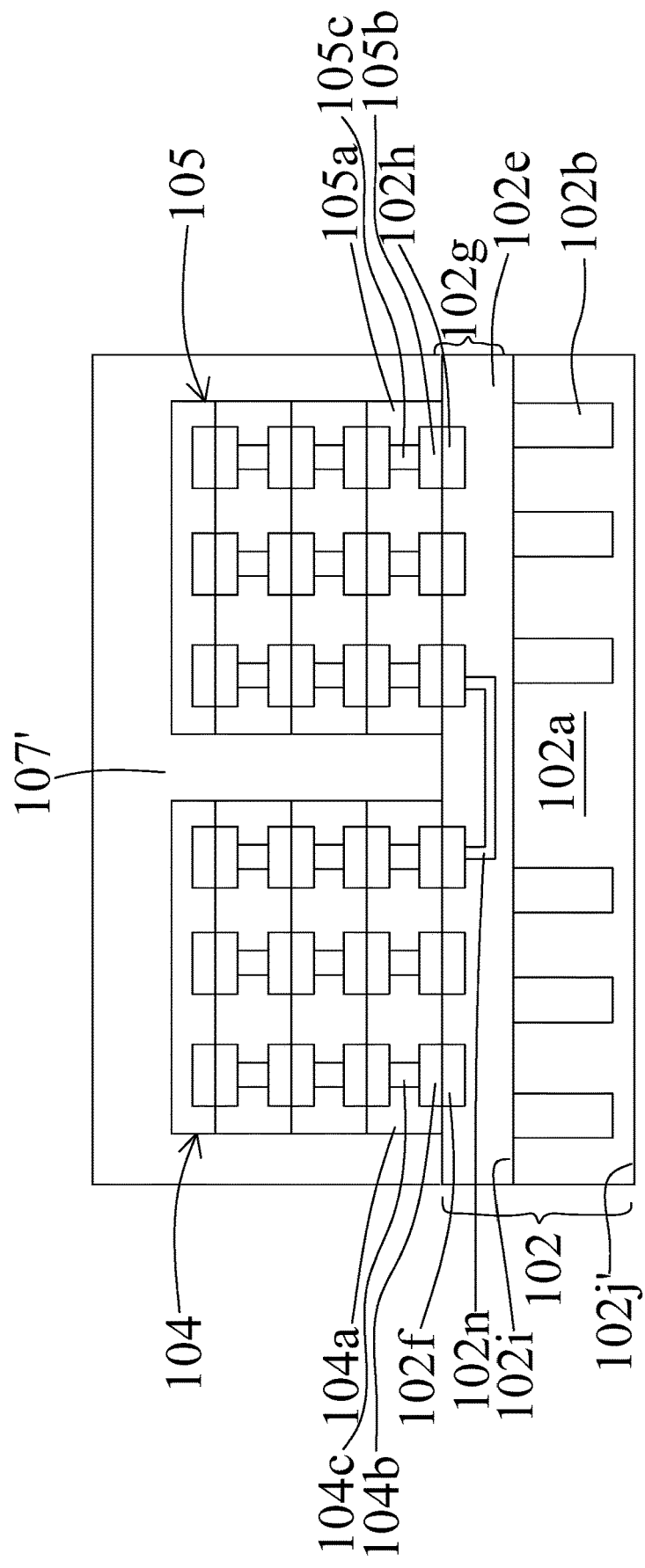
Figure 22:
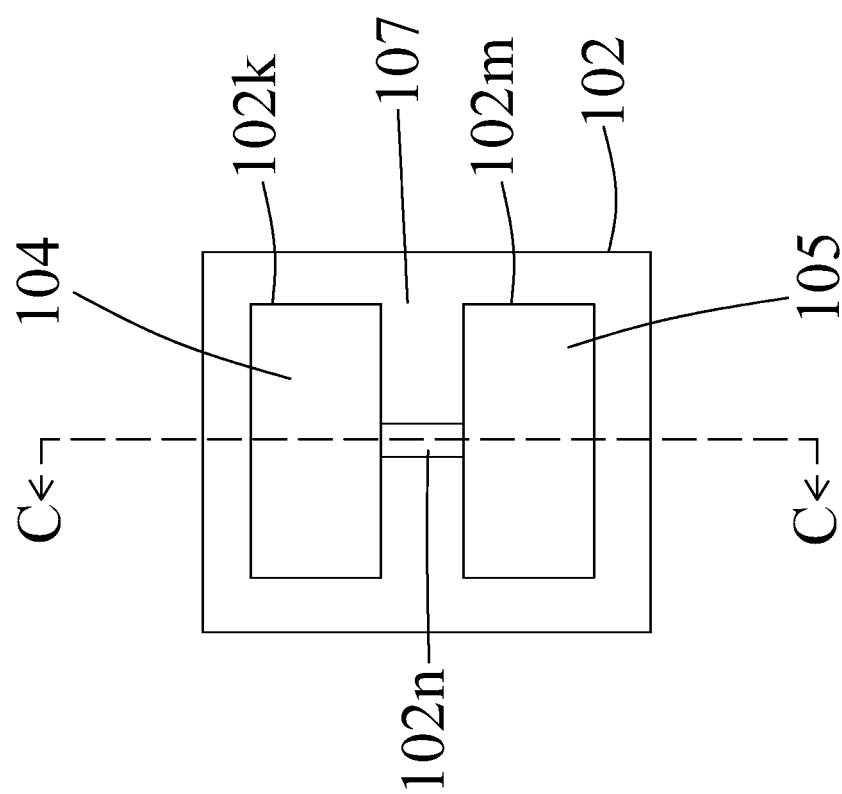
Figure 23:
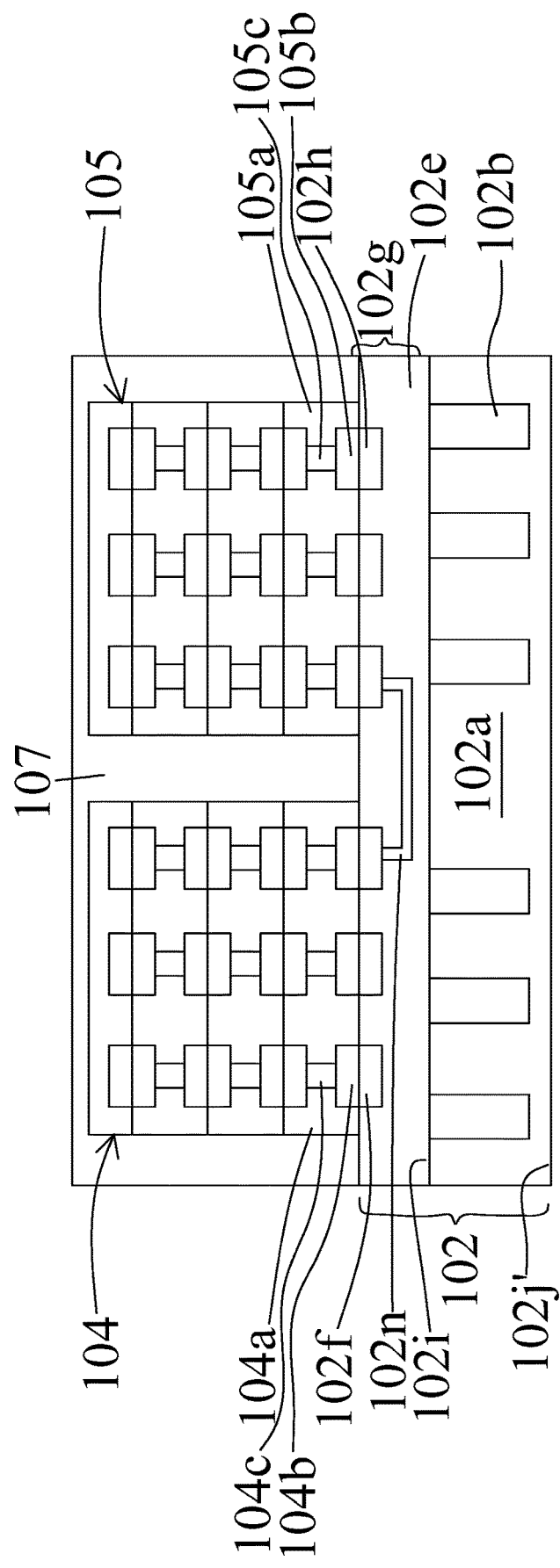

Referring to FIGS. 20 to 23, a first molding 107 is formed over the second interposer 102 and surrounding the second die 104 and the third die 105 according to step S206 in FIG. 5. FIG. 20 is a top view of the third die 105, the second die 104 and the second interposer 102, and FIG. 21 is a cross-sectional view of the third die 105, the second die 104 and the second interposer 102 along a line C-C of FIG. 20. FIG. 22 is a top view of the third die 105, the second die 104 and the second interposer 102, and FIG. 23 is a cross-sectional view of the third die 105, the second die 104 and the second interposer 102 along a line C-C of FIG. 22. In some embodiments, the first molding 107 has a configuration similar to that of the first molding 107 illustrated in FIGS. 1 to 4 and discussed above.

In some embodiments, the first molding 107 is formed by disposing a first molding material 107' over the second interposer 102 and covering the second die 104 and the third die 105 as shown in FIGS. 20 to 21, and then grinding the first molding material 107' to reduce its height to form the first molding 107 as shown in FIGS. 22 to 23. In some embodiments, the first molding 107 is formed after the disposing of the second die 104 and the disposing of the third die 105. In some embodiments, the first molding material 107' includes molding material such as molding compound, epoxy, or the like.

Figure 24:
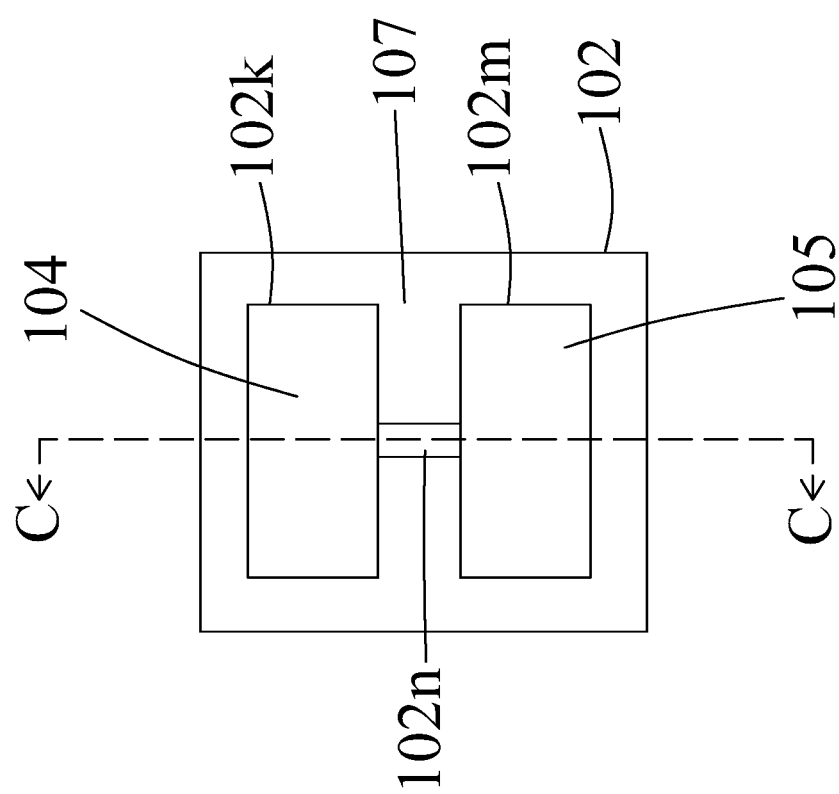
Figure 25:
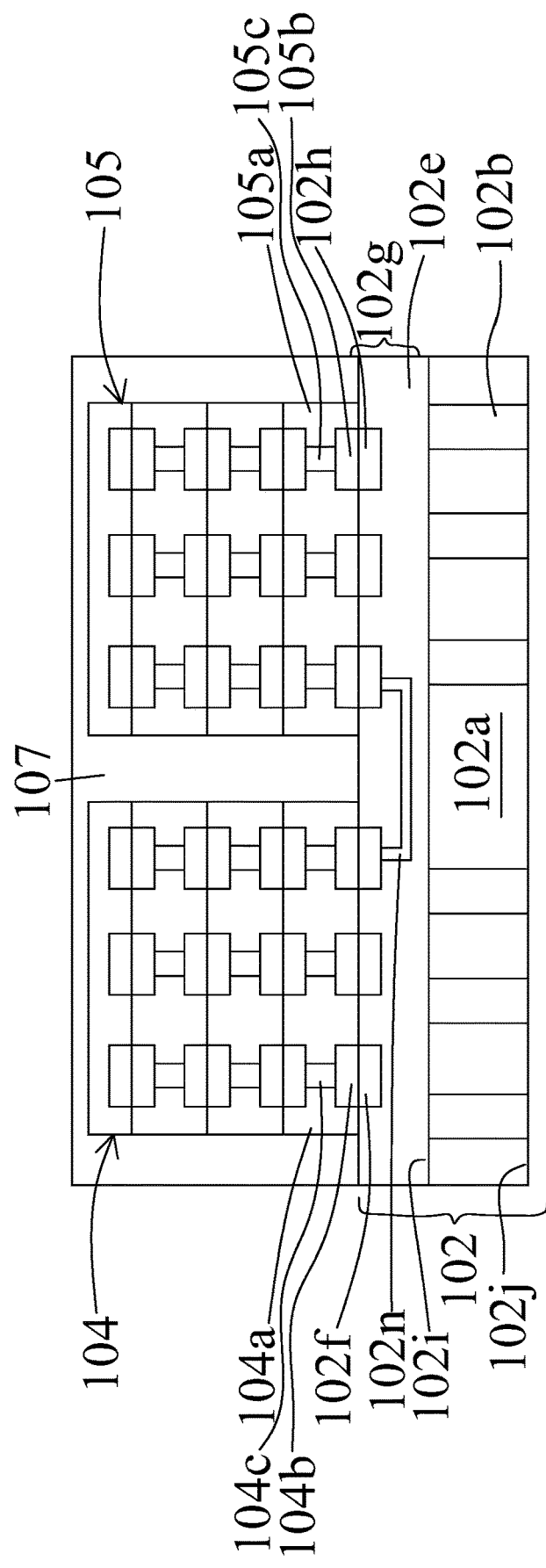

In some embodiments, after the formation of the first molding 107, the untreated fourth surface 102j' is processed to become a fourth surface 102j exposing the second via 102b as shown in FIGS. 24 to 25. FIG. 24 is a top view of the first molding 107, the third die 105, the second die 104 and the second interposer 102, and FIG. 25 is a cross-sectional view of the first molding 107, the third die 105, the second die 104 and the second interposer 102 along a line C-C of FIG. 24.

Figure 26:
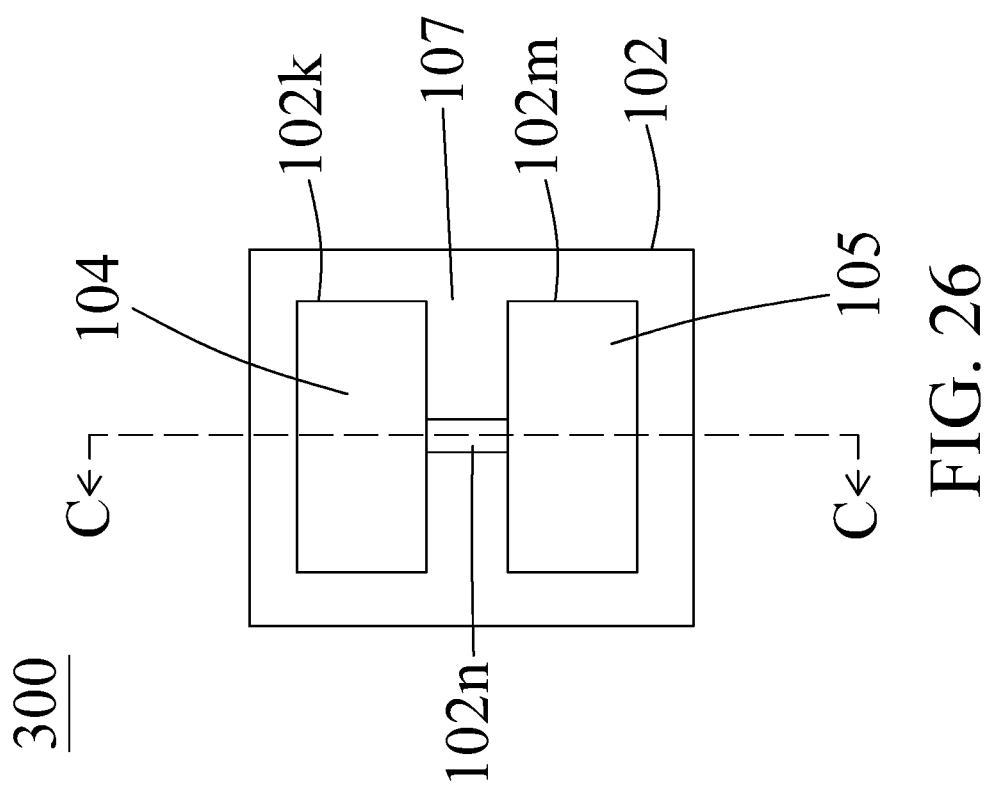
Figure 27:
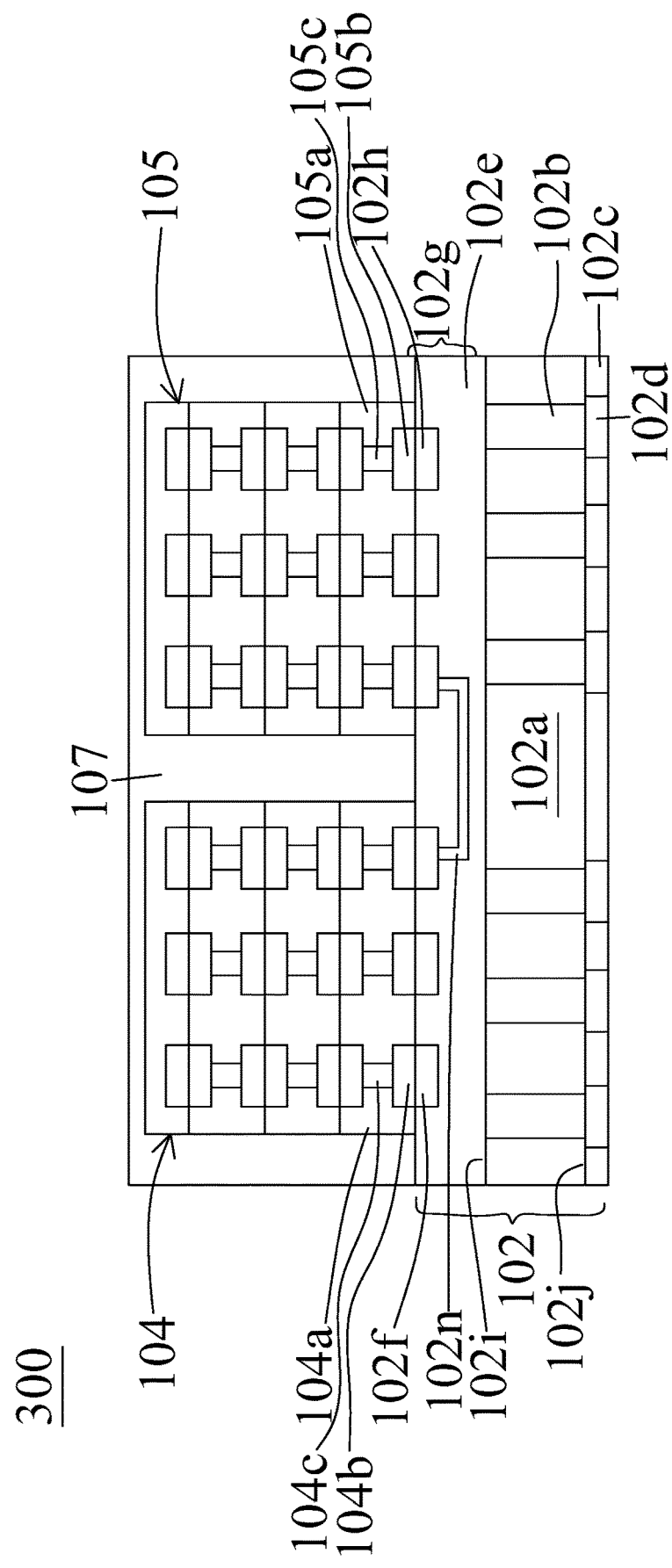

In some embodiments, after the formation of the fourth surface 102*j*, a second bonding layer 102*c* and a second bonding pad 102*d* are formed over the fourth surface 102*j* of the second interposer 102 as shown in FIGS. 26 and 27. In some embodiments, the second bonding layer 102*c* and the second bonding pad 102*d* are formed after the formation of the first molding 107. In some embodiments, the second bonding layer 102*c* is formed by deposition or any other suitable process. In some embodiments, the second bonding layer 102*c* includes dielectric materials, such as silicon oxide, silicon oxynitride, silicon nitride or the like. In some embodiments, the second bonding pad 102*d* is formed by electroplating or any other suitable process. In some embodiments, the second bonding pad 102*d* includes conductive material such as gold, silver, copper, nickel, tungsten, aluminum, tin, alloys thereof or the like. In some embodiments, the intermediate structure 300 is formed as shown in FIGS. 26 and 27.

Figure 28:
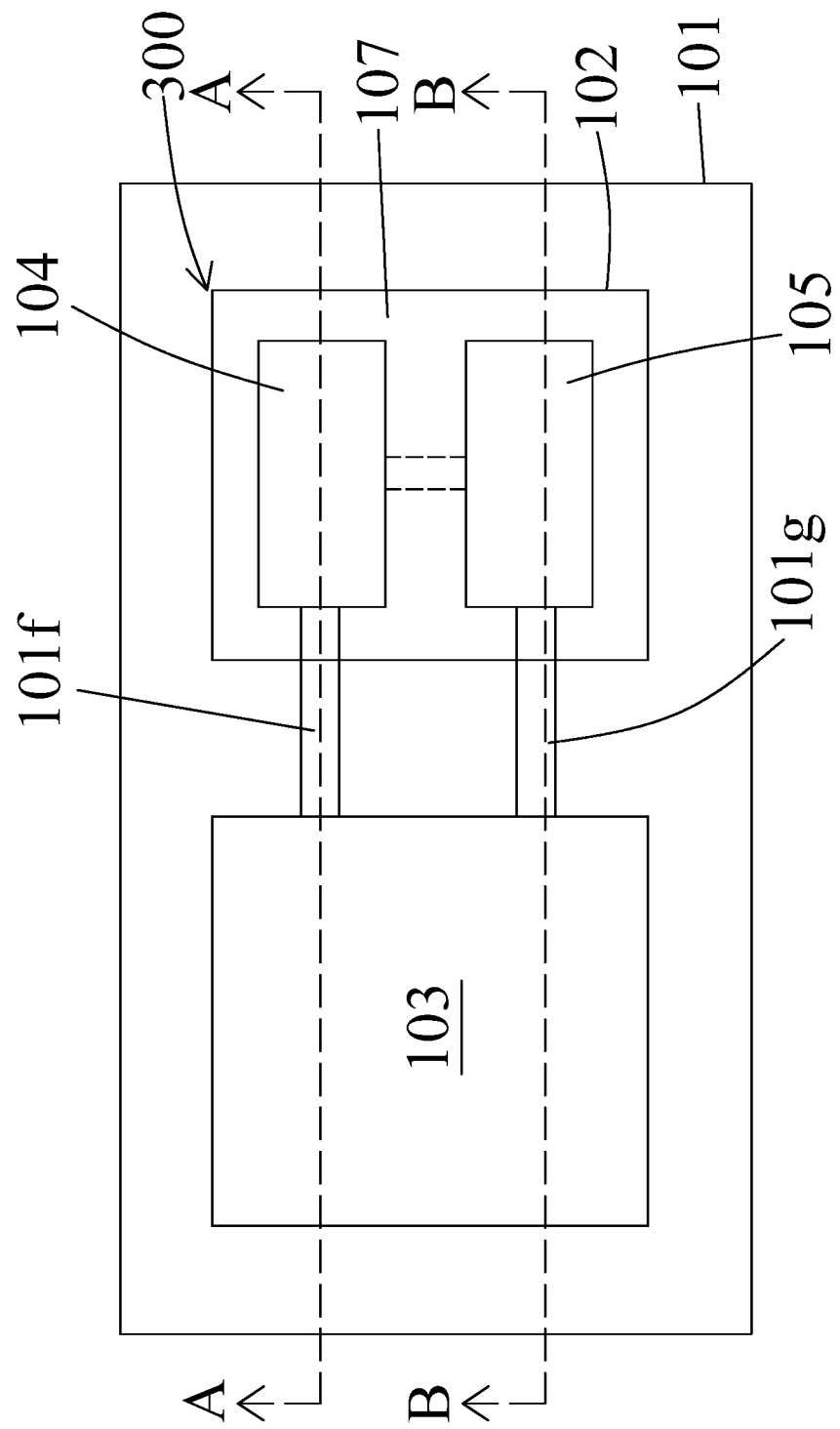
Figure 29:
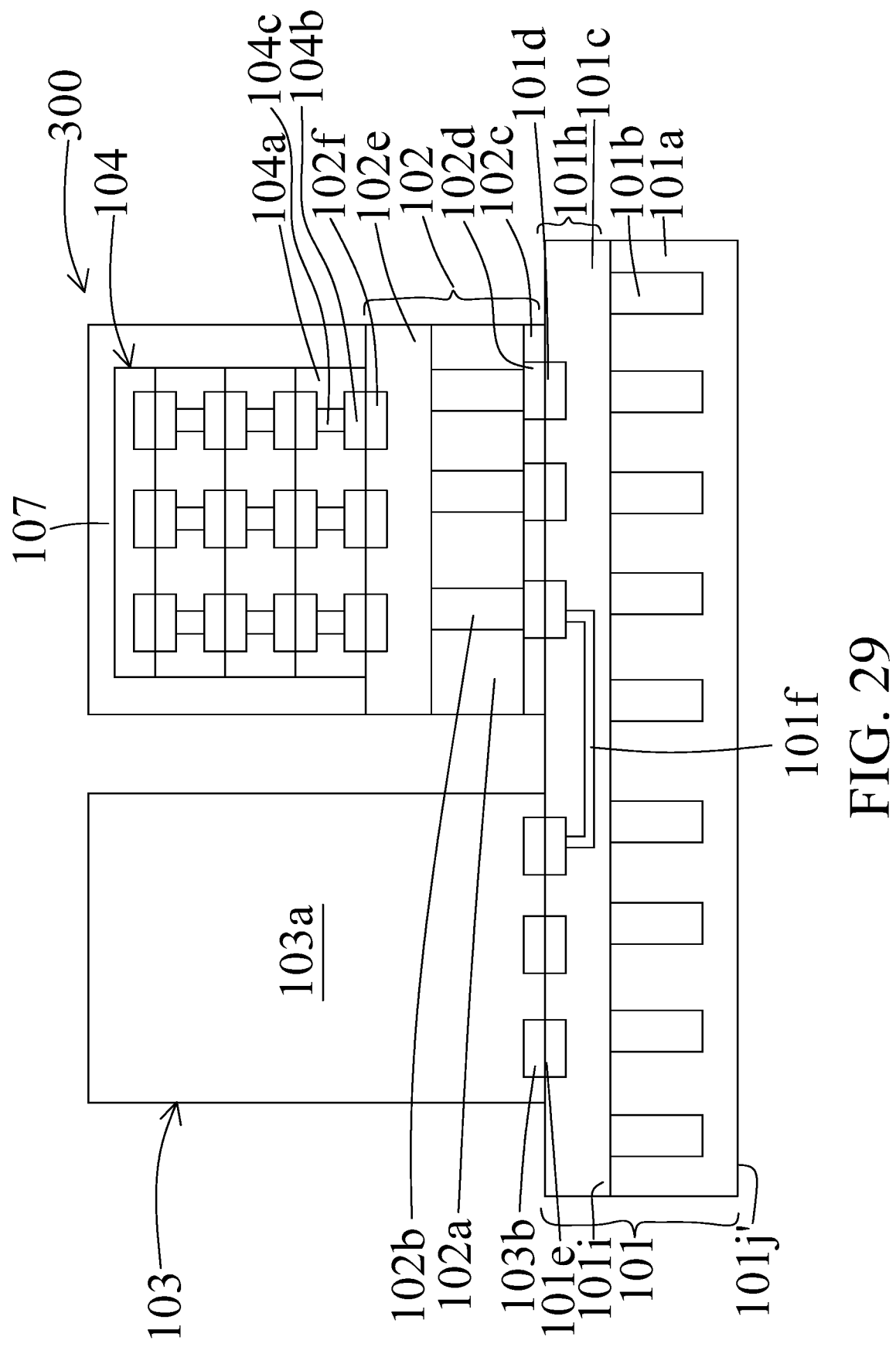
Figure 30:
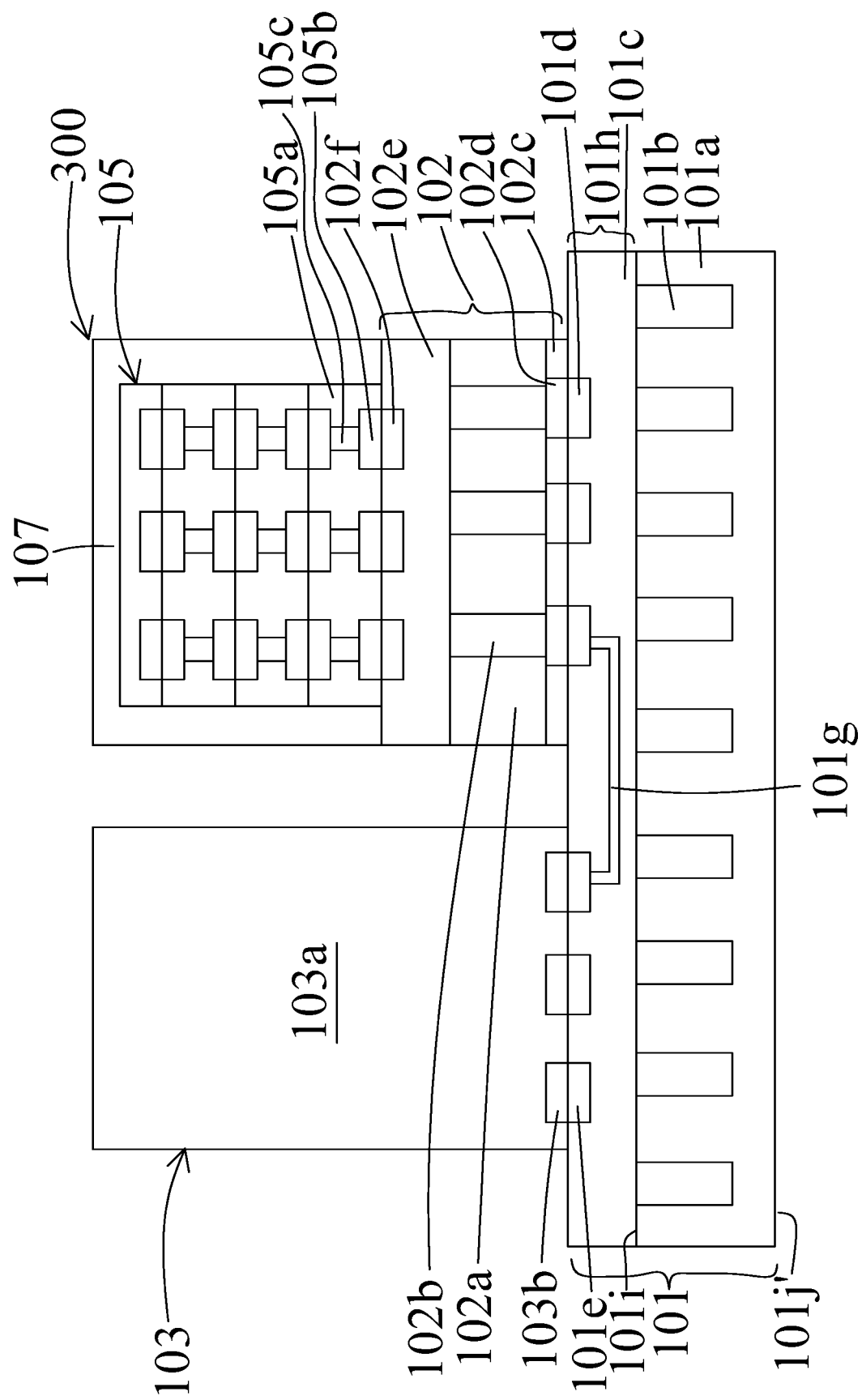

Referring to FIGS. 28 to 30, the intermediate structure 300 is disposed over the first interposer 101 according to step S207 in FIG. 5. FIG. 28 is a top view of the intermediate structure 300, the first die 103 and the first interposer 101, FIG. 29 is a cross-sectional view of the intermediate structure 300, the first die 103 and the first interposer 101 along a line A-A of FIG. 28, and FIG. 30 is a cross-sectional view of the intermediate structure 300, the first die 103 and the first interposer 101 along a line B-B of FIG. 28.

In some embodiments, the intermediate structure 300 is disposed by bonding the second bonding layer 102*c* to the first bonding layer 101*c*, and bonding the first bonding pad 101*d* to the second bonding pad 102*d*. In some embodiments, the intermediate structure 300 is disposed by hybrid bonding. In some embodiments, the disposing of the first die 103 and the disposing of the intermediate structure 300 are implemented simultaneously or separately. After the bonding of the intermediate structure 300 to the first interposer 101, the first die 103 is electrically connected to the second die 104 via the first communication member 101*f* and is electrically connected to the third die 105 via the second communication member 101*g*.

Referring to FIGS. 31 to 36, a second molding 108 is formed over the first interposer 101 and surrounding the first die 103, and the intermediate structure 300 is formed according to step S208 in FIG. 5. FIG. 28 is a top view of the intermediate structure 300, the first die 103 and the first interposer 101, FIG. 29 is a cross-sectional view of the intermediate structure 300, the first die 103 and the first interposer 101 along a line A-A of FIG. 28, and FIG. 30 is a cross-sectional view of the intermediate structure 300, the first die 103 and the first interposer 101 along a line B-B of FIG. 28. In some embodiments, the second molding 108 has a configuration similar to that of the second molding 108 illustrated in FIGS. 1 to 4. In some embodiments, the first molding 107 is formed prior to the formation of the second molding 108.

Figure 31:
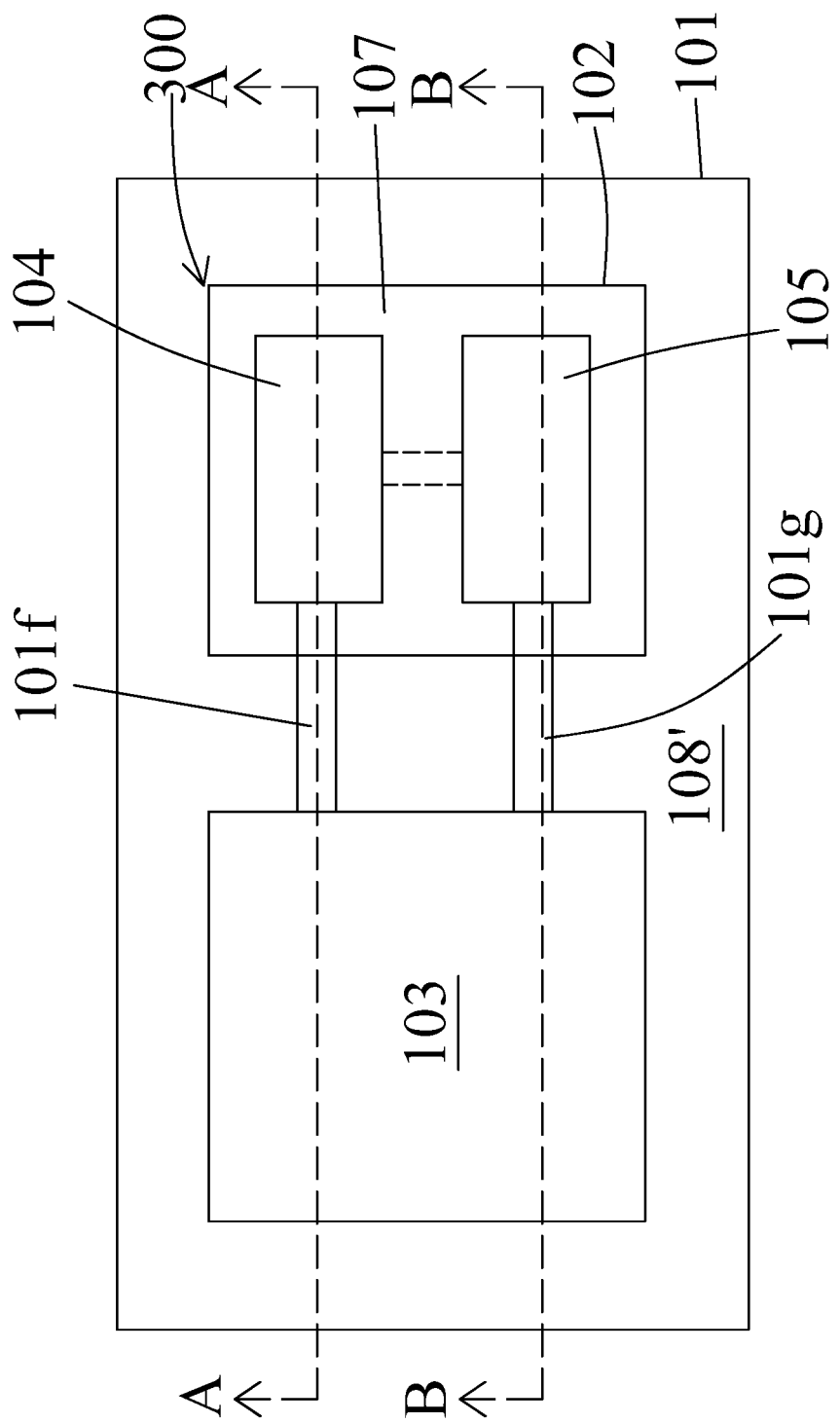
Figure 32:
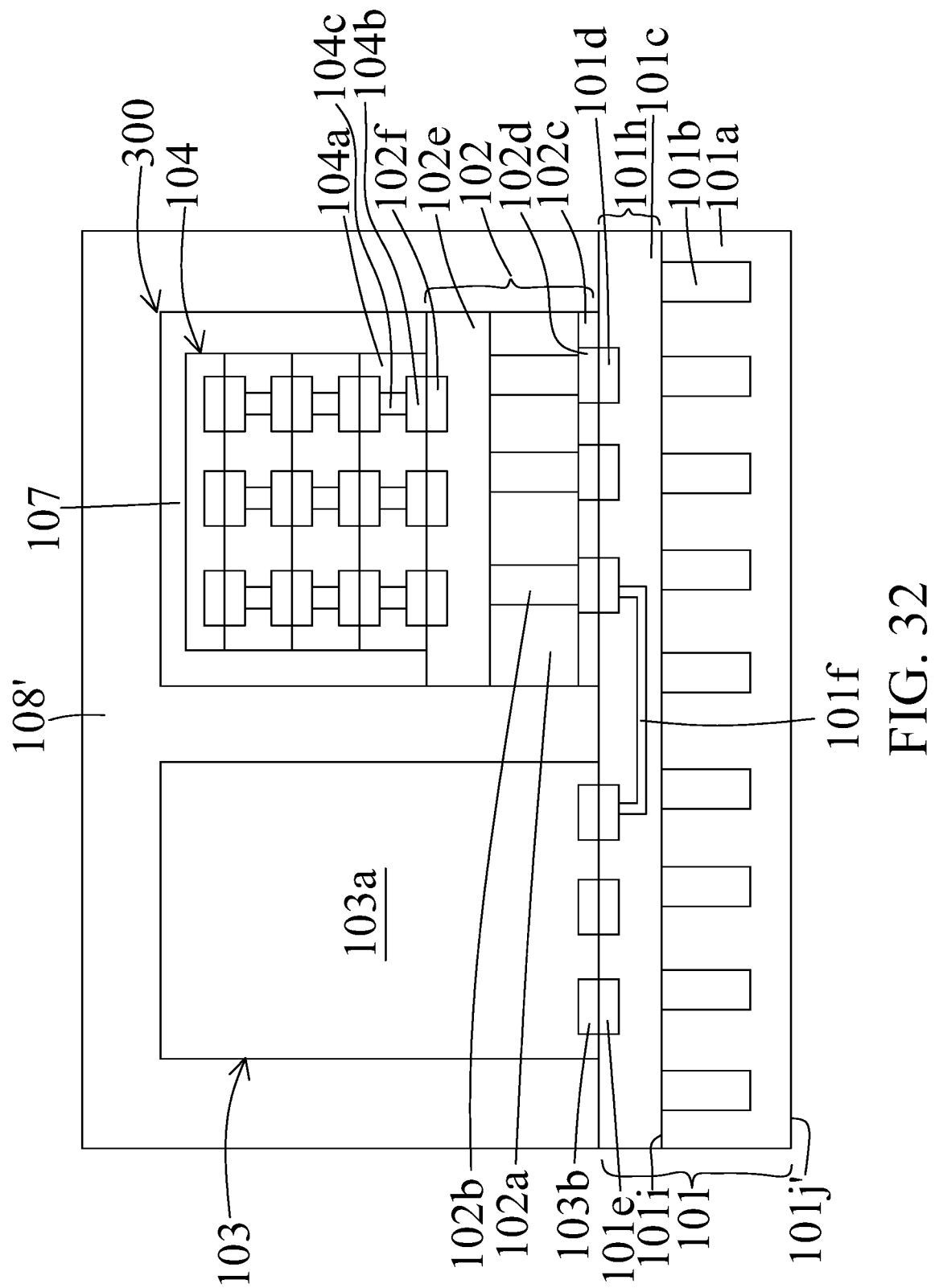
Figure 33:
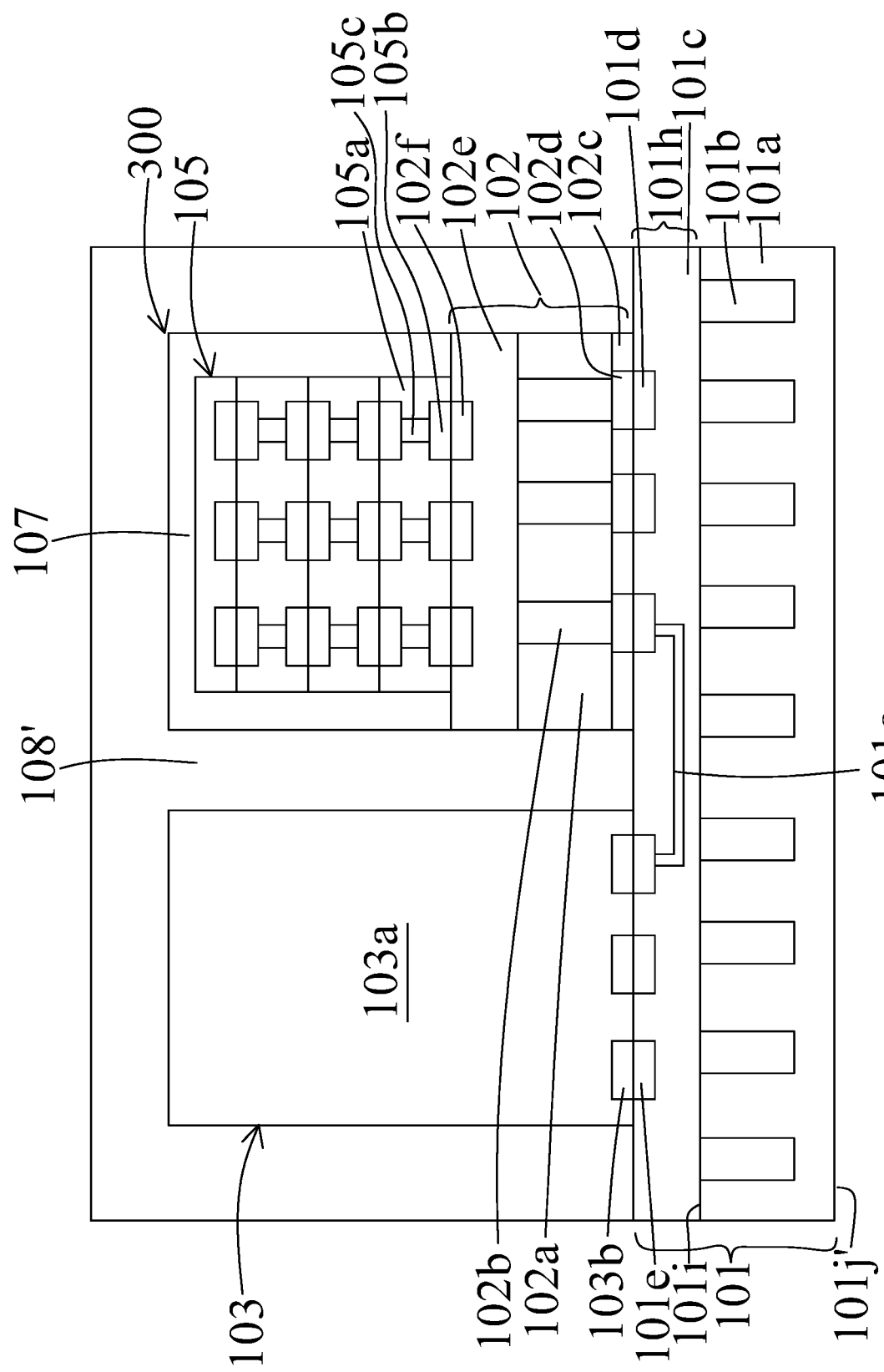
Figure 34:
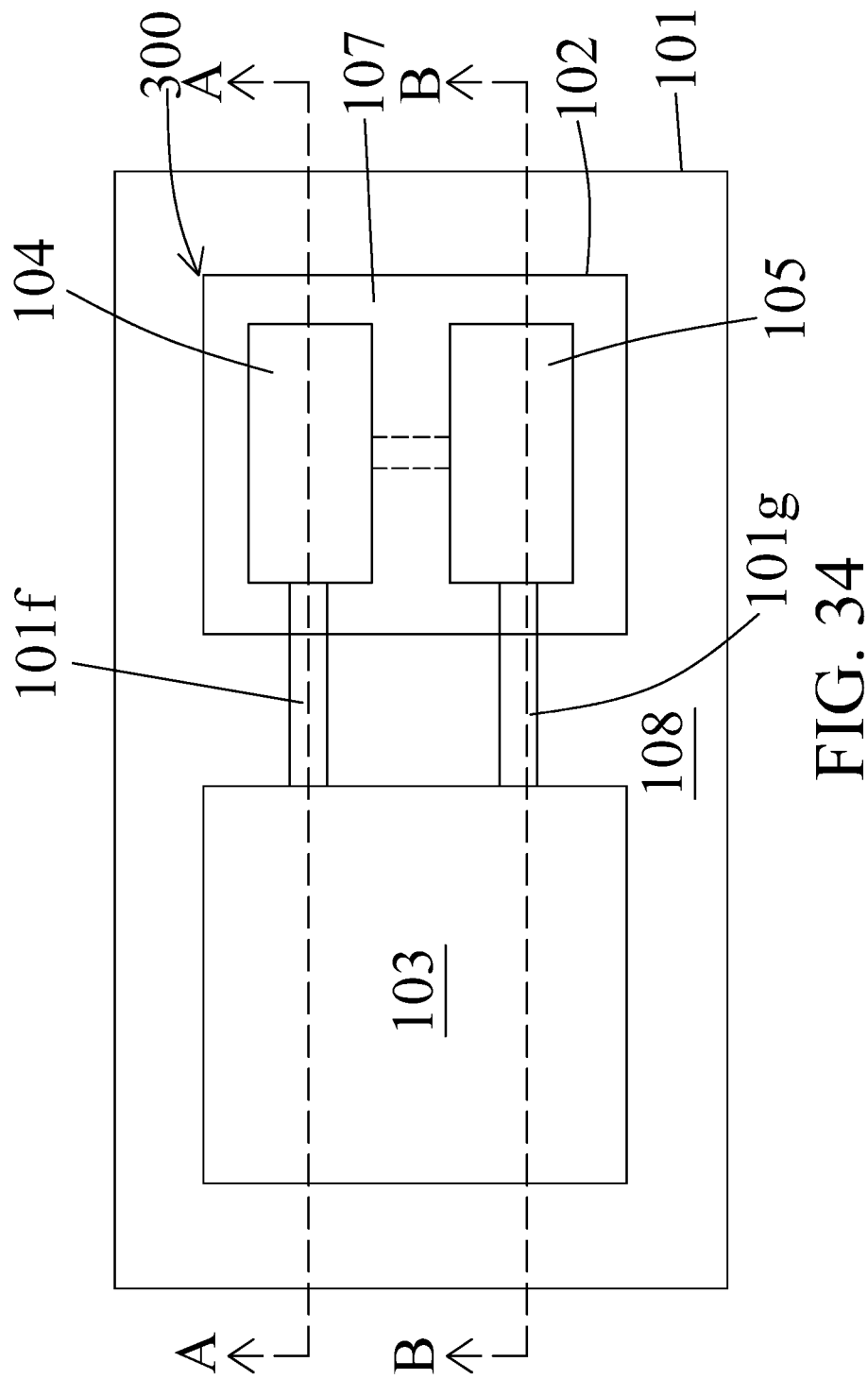
Figure 35:
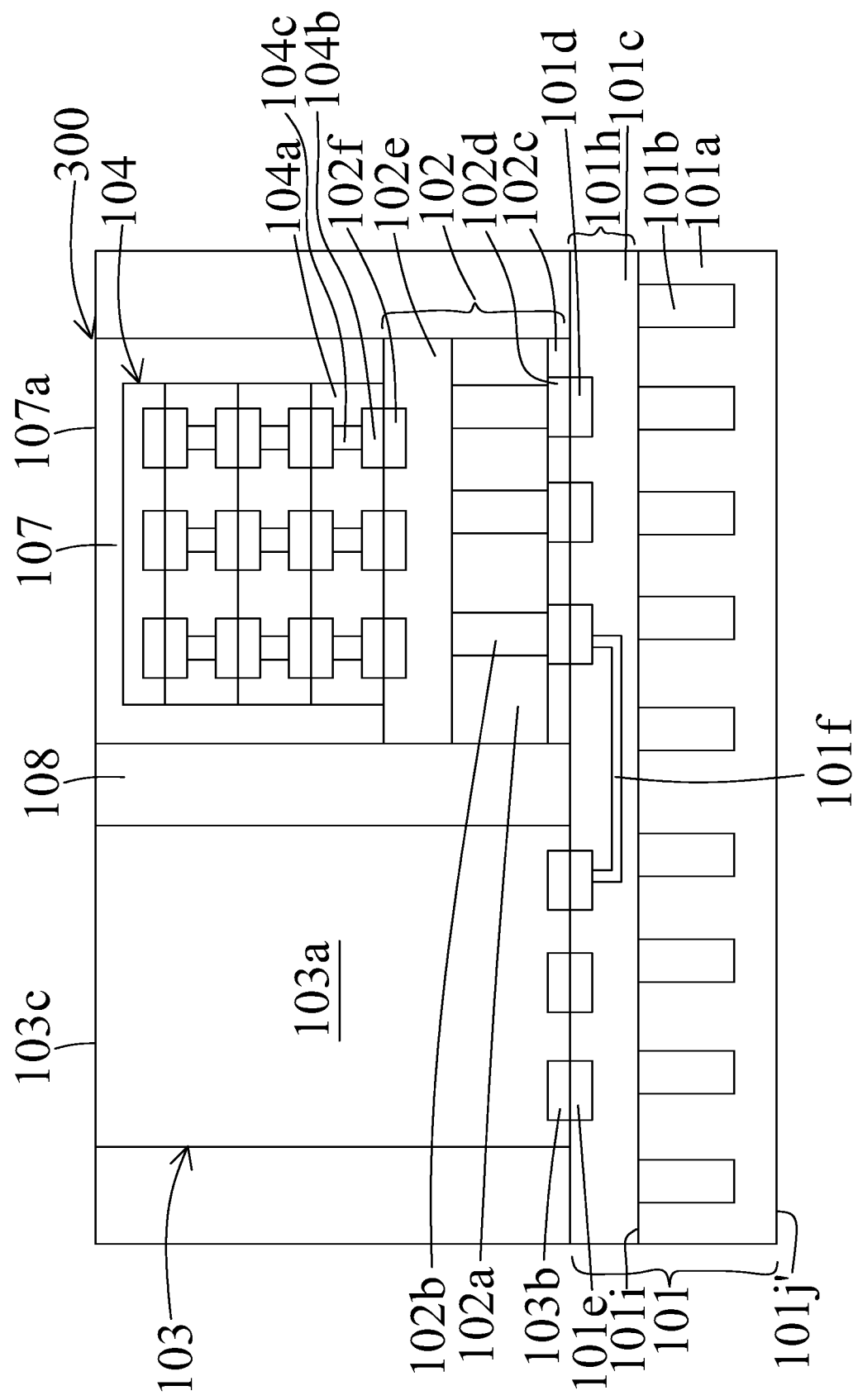
Figure 36:
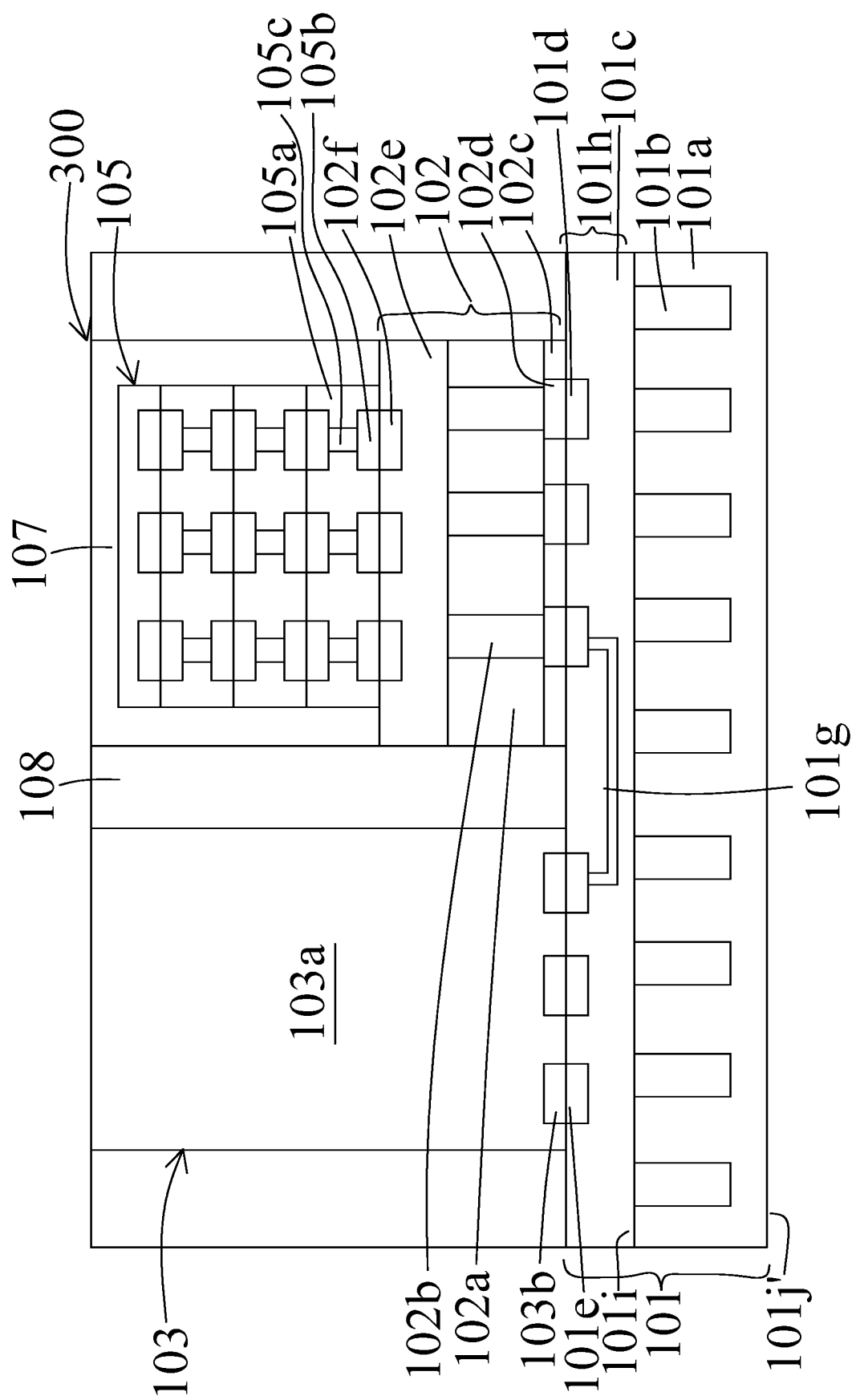

In some embodiments, the second molding 108 is formed by disposing a second molding material 108' over the first interposer 101 and covering the first die 103 and the intermediate structure 300 as shown in FIGS. 31 to 33, and then grinding the second molding material 108' to reduce its height to form the second molding 108 and expose a top surface 103*c* of the first die 103 and a top surface 107*a* of the first molding 107 as shown in FIGS. 34 to 36. In some embodiments, portions of the first molding 107 are also removed during the grinding of the second molding material 108'. In some embodiments, the second molding material 108' includes molding material such as molding compound, epoxy, or the like.

Figure 37:
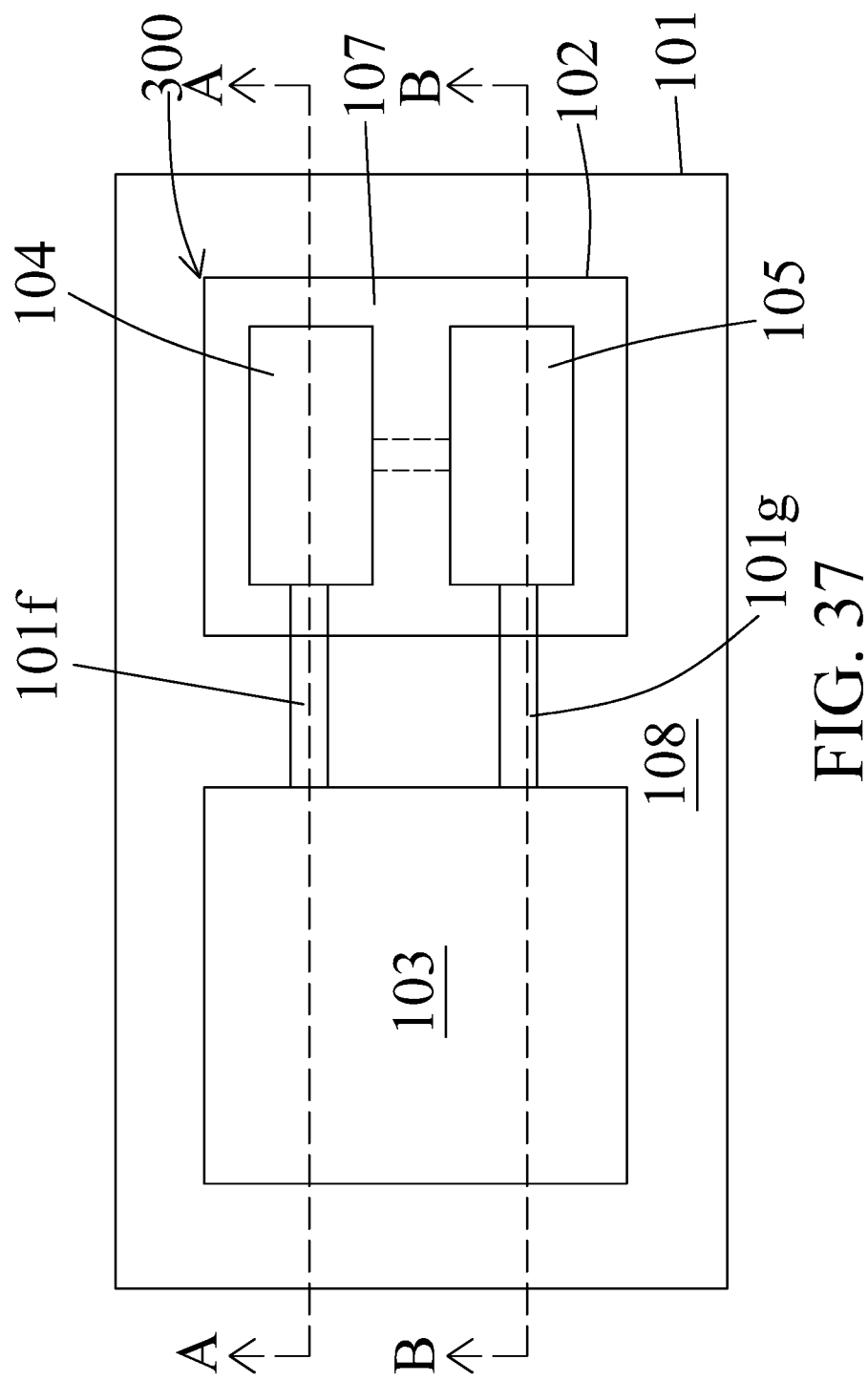
Figure 38:
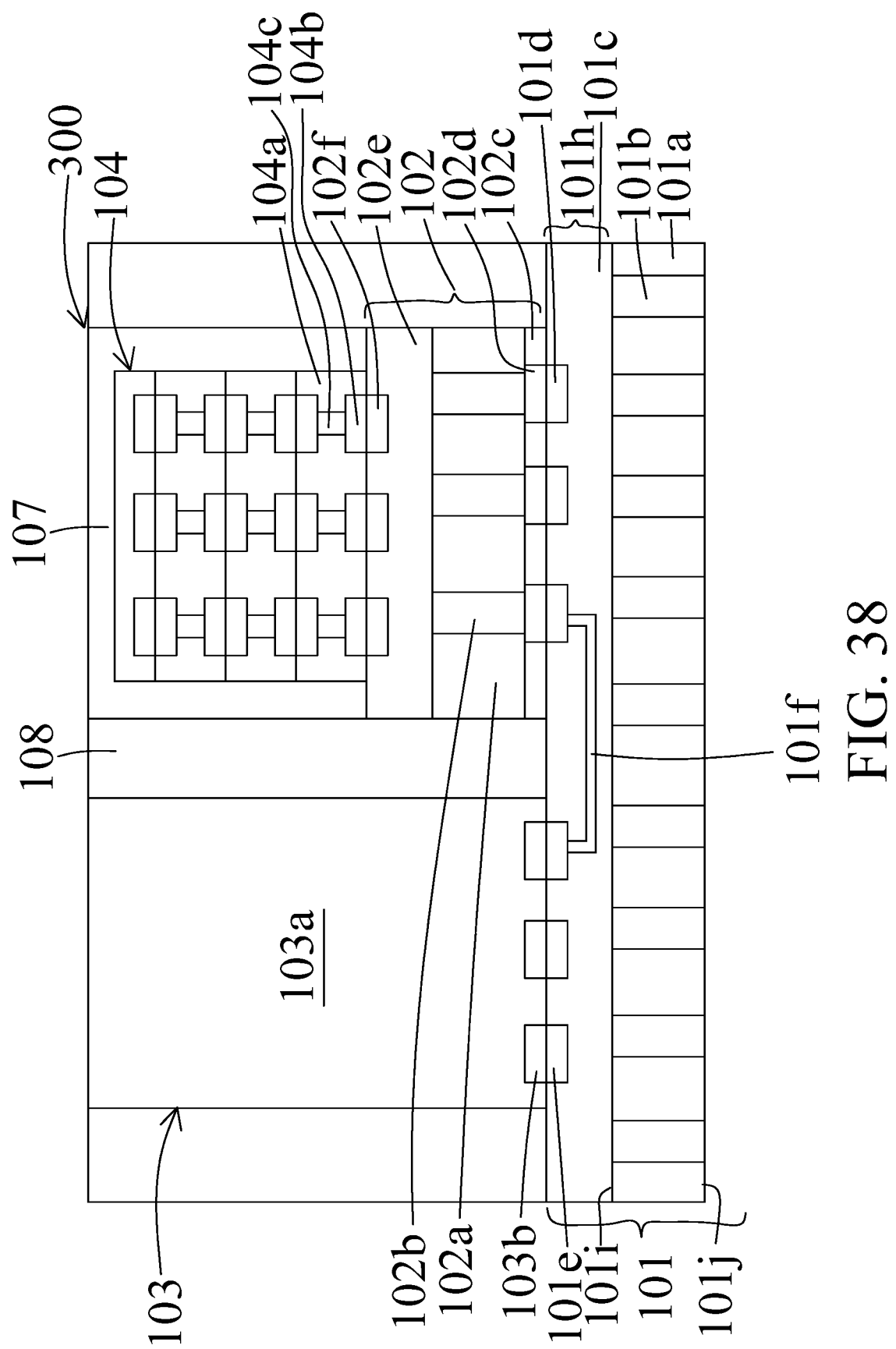
Figure 39:
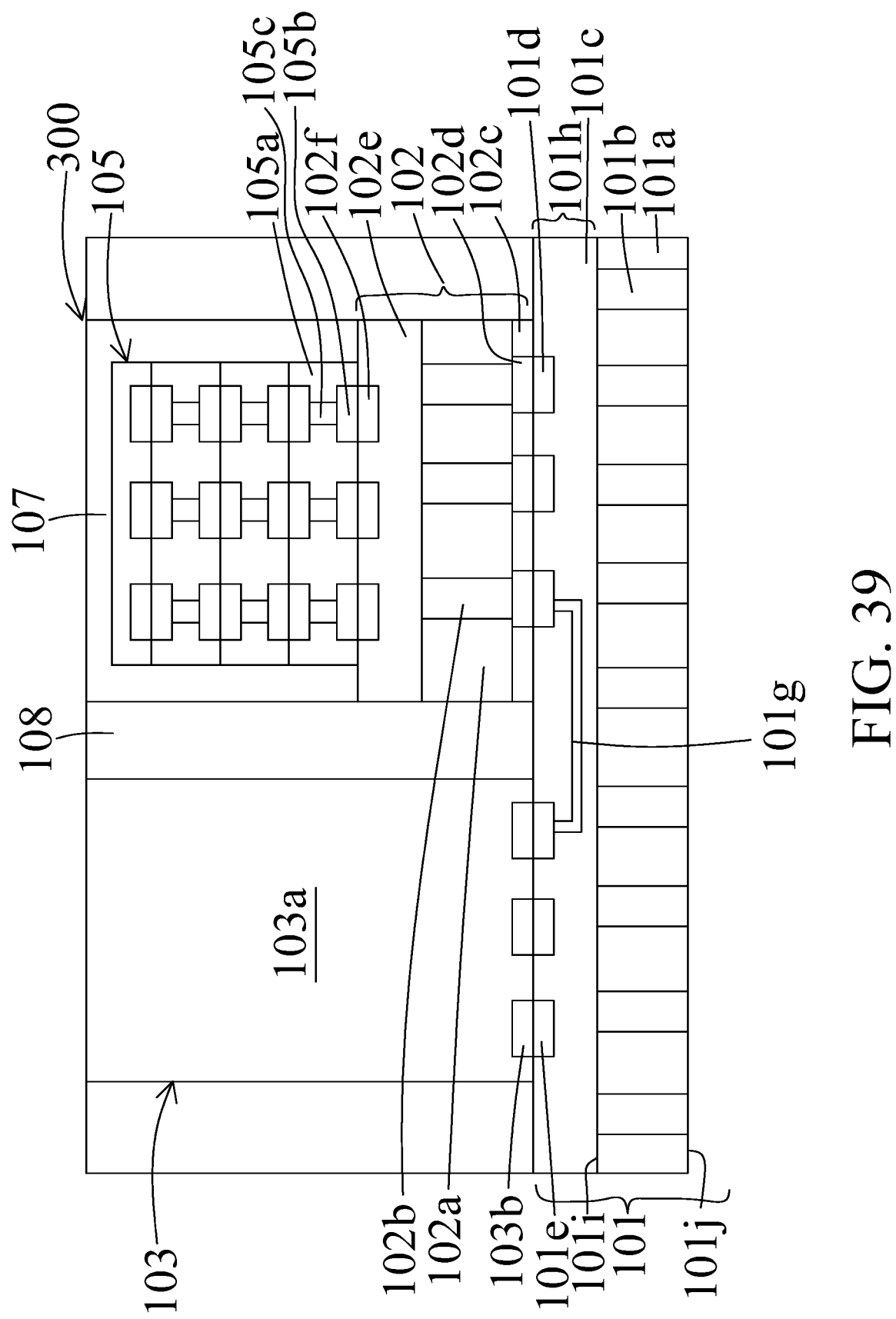

In some embodiments, after the formation of the second molding 108, the untreated second surface 101*j*' is processed to become a second surface 101*j* exposing the first via 101*b* as shown in FIGS. 37 to 39. FIG. 37 is a top view of the second molding 108, the first molding 107, the first die 103 and the intermediate structure 300. FIG. 38 is a cross-sectional view of the second molding 108, the first molding 107, the first die 103 and the intermediate structure 300 along a line A-A of FIG. 37, and FIG. 39 is a cross-sectional view of the second molding 108, the first molding 107, the first die 103 and the intermediate structure 300 along a line C-C of FIG. 37.

Figure 40:
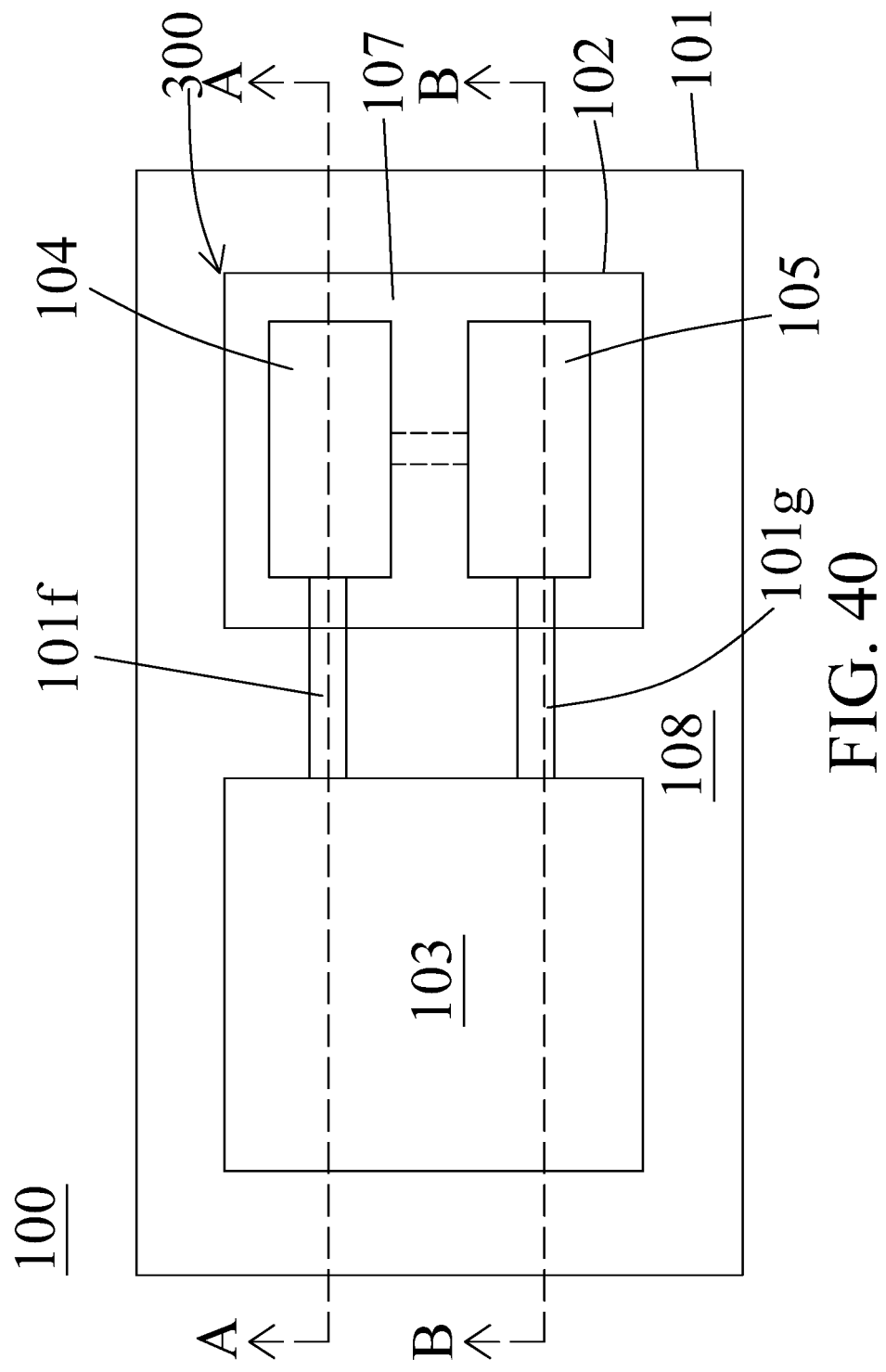
Figure 41:
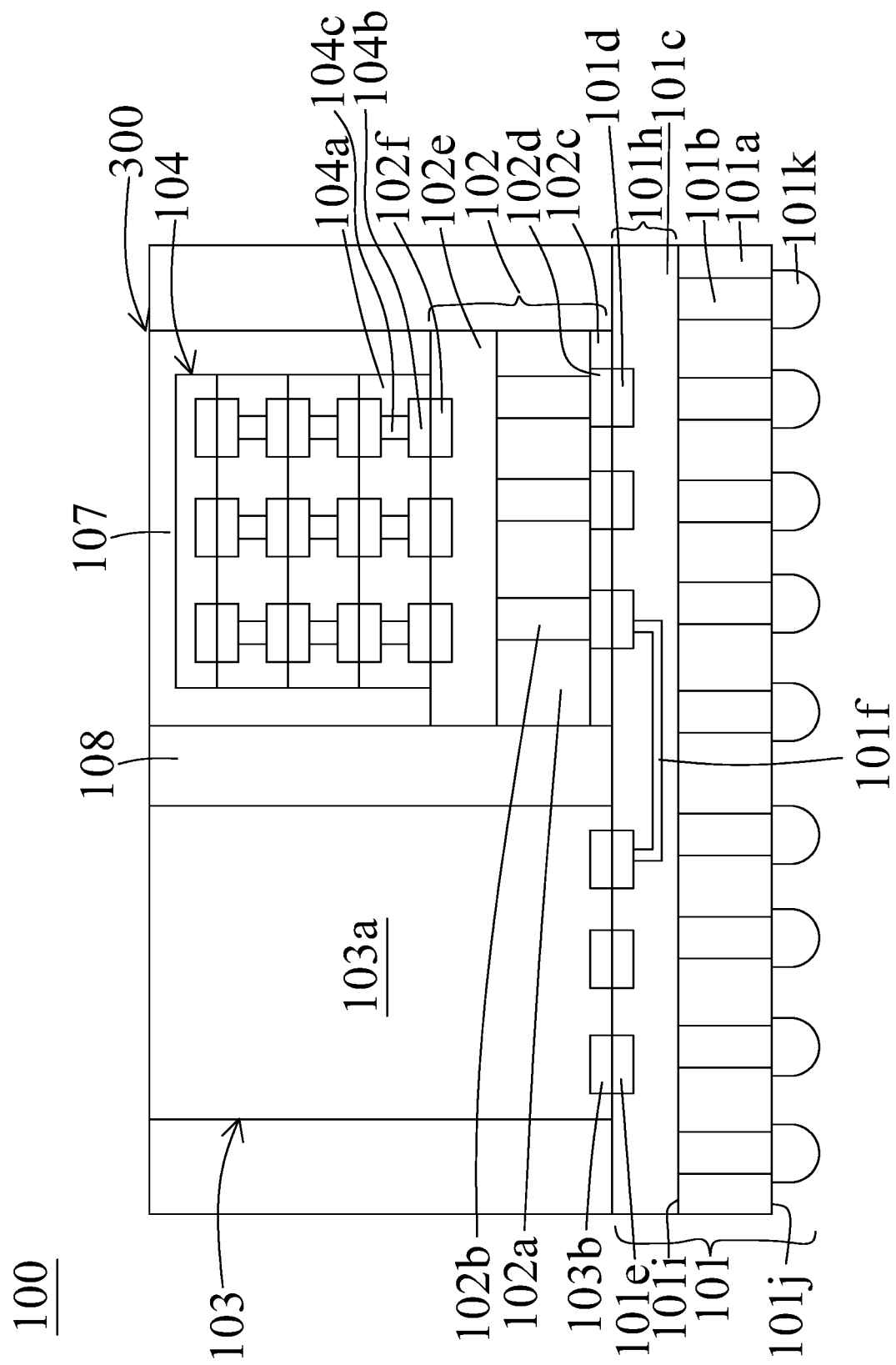
Figure 42:
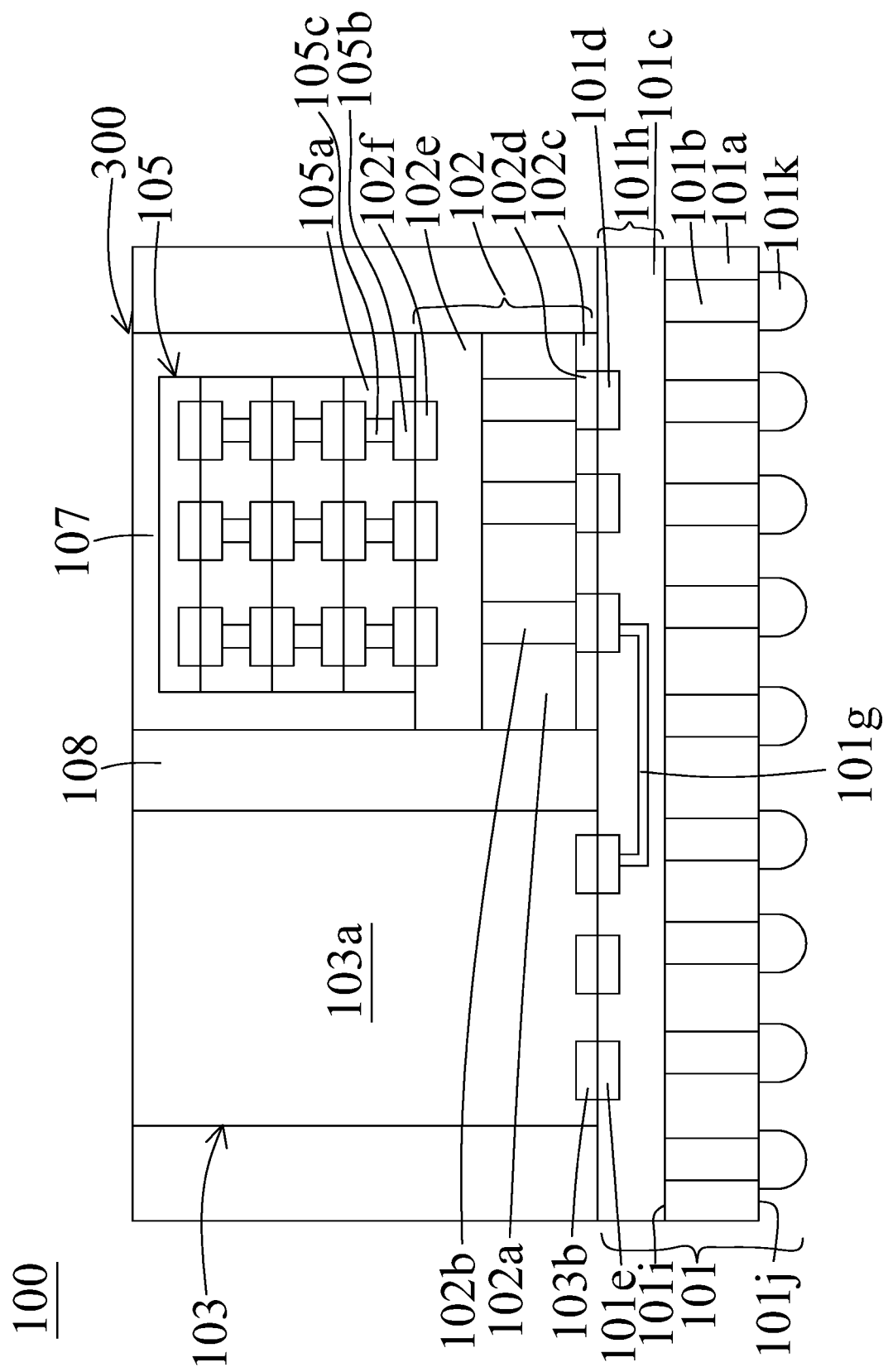

In some embodiments, after the formation of the second surface 101*j*, a conductive bump 101*k* is disposed under the first interposer 101 as shown in FIGS. 40 and 42. In some embodiments, the conductive bump 101*k* is electrically coupled to the first via 101*b*. In some embodiments, the conductive bump 101*k* includes low-temperature reflowable material. In some embodiments, the conductive bump 101*k* includes soldering material such as tin, lead, silver, copper, nickel, bismuth, or a combination thereof. In some embodiments, the conductive bump 101*k* includes conductive material such as gold, silver, copper, nickel, tungsten, aluminum, tin, alloys thereof or the like. In some embodiments, the conductive bump 101*k* is a ball grid array (BGA) ball, a controlled collapse chip connection (C4) bump, a microbump or the like. In some embodiments, the conductive bump 101*k* is disposed by ball mounting, electroplating or any other suitable process. In some embodiments, the semiconductor package structure 100 is formed as shown in FIGS. 40 to 42.

In conclusion, because communication members are included in an inactive interposer of a semiconductor package structure, a logic die can communicate with several memory dies. Further, a communication member is included in an active interposer of the semiconductor package structure, so that the memory dies can communicate with each other. Therefore, an operation speed of the semiconductor package structure can be increased or improved. An overall dimension of the semiconductor package structure can be reduced.

One aspect of the present disclosure provides a semiconductor package structure. The semiconductor package structure includes a first interposer including a first substrate and a first interconnect layer over the first substrate; a second interposer disposed over the first interposer, wherein the second interposer includes a second substrate and a second interconnect layer over the second substrate; a first die disposed over the first interposer and adjacent to the second interposer; a second die disposed over the second interposer; a first molding disposed over the second interposer and surrounding the second die; and a second molding disposed over the first interposer and surrounding the first die and the first molding, wherein the first interconnect layer includes a first communication member electrically connecting the first die to the second interposer and the second die.

Another aspect of the present disclosure provides a semiconductor package structure. The semiconductor package structure includes a first interposer including a first substrate and a first bonding layer over the first substrate, a first bonding pad at least partially exposed through the first bonding layer, a first communication member disposed within the first bonding layer, and a second communication member disposed within the first bonding layer; a second interposer disposed over the first interposer, wherein the second interposer includes a second substrate, a second bonding layer under the second substrate and bonded to the first bonding layer, a second bonding pad at least partially exposed through the second dielectric layer and bonded to the first bonding pad, a dielectric layer disposed over the second substrate, and a third communication member disposed within the dielectric layer; a first die disposed over the first bonding layer and adjacent to the second interposer; a second die disposed over the second interposer; and a third die disposed over the second interposer and adjacent to the second die, wherein the first communication member electrically connects the first die to the second interposer and the second die, the second communication member electrically connects the first die to the third die, and the third communication member electrically connects the second die to the third die.

Another aspect of the present disclosure provides a method of manufacturing a semiconductor package structure. The method includes steps of providing a first interposer including a first substrate and a first interconnect layer over the first substrate, wherein the first interconnect layer includes a first communication member and a second communication member; providing a second interposer including a second substrate and a second interconnect layer over the second substrate, wherein the second interconnect layer includes a third communication member; disposing a first die over the first interposer; forming an intermediate structure including: disposing a second die over the second interposer, disposing a third die over the second interposer and adjacent to the second die, and forming a first molding disposed over the second interposer and surrounding the second die and the third die; disposing the intermediate structure over the first interposer; and forming a second molding over the first interposer and surrounding the first die and the intermediate structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor package structure, comprising:
    a first interposer including a first substrate and a first interconnect layer over the first substrate;
    a second interposer disposed over the first interposer, wherein the second interposer includes a second substrate and a second interconnect layer positioned above the second substrate;
    a first die disposed over the first interposer and adjacent to the second interposer;
    a second die disposed over the second interposer;
    a first molding disposed over the second interposer and surrounding the second die; and
    a second molding disposed over the first interposer and surrounding the first die and the first molding,
    wherein the first interconnect layer includes a first communication member electrically connecting the first die to the second interposer and the second die;
    wherein a thickness of the first die is substantially equal to a total of a thickness of the second die and a thickness of the second interposer.

2. The semiconductor package structure of claim 1, wherein the first communication member is disposed under the second molding.

3. The semiconductor package structure of claim 1, wherein the second substrate is positioned between the second die and the second interconnect layer.

4. The semiconductor package structure of claim 1, wherein the first interposer is an inactive interposer, and the second interposer is an active interposer.

5. The semiconductor package structure of claim 1, wherein the first die is a logic die and the second die is a DRAM die.

6. The semiconductor package structure of claim 1, further comprising a third die disposed over the second interposer, surrounded by the first molding and disposed adjacent to the second die.

7. The semiconductor package structure of claim 6, wherein the second interposer defines a first control area under the second die, and a second control area adjacent to the first control area and under the third die.

8. The semiconductor package structure of claim 6, wherein the first interconnect layer includes a second communication member electrically connecting the first die to the third die.

9. The semiconductor package structure of claim 8, wherein the second communication member is disposed under the second molding.

10. The semiconductor package structure of claim 6, wherein the second interconnect layer includes a third communication member electrically connecting the second die to the third die.

11. The semiconductor package structure of claim 10, wherein the third communication member is disposed under the first molding.

12. The semiconductor package structure of claim 6, wherein the second die and the third die are memory dies.

13. The semiconductor package structure of claim 6, wherein the third die is a Flash memory die.

14. A semiconductor package structure, comprising:
    a first interposer including a first substrate and a first bonding layer over the first substrate, a first bonding pad at least partially exposed through the first bonding layer, a first communication member disposed within the first bonding layer, and a second communication member disposed within the first bonding layer;
    a second interposer disposed over the first interposer, wherein the second interposer includes a second substrate, a second bonding layer under the second substrate and bonded to the first bonding layer, a second bonding pad at least partially exposed through the second dielectric layer and bonded to the first bonding pad, a dielectric layer disposed over the second substrate, and a third communication member disposed within the dielectric layer;

a first die disposed over the first bonding layer and adjacent to the second interposer;

a second die disposed over the second interposer; and a third die disposed over the second interposer and adjacent to the second die, wherein the first communication member electrically connects the first die to the second interposer and the second die, the second communication member electrically connects the first die to the third die, and the third communication member electrically connects the second die to the third die.

15. The semiconductor package structure of claim 14, wherein the first die includes a first die pad bonded to a third bonding pad of the first interposer, and the third bonding pad is at least partially exposed through the first bonding layer.

16. The semiconductor package structure of claim 14, wherein the second die includes a second die pad bonded to a fourth bonding pad of the second interposer, the fourth bonding pad is at least partially exposed through the dielectric layer, the third die includes a third die pad bonded to a fifth bonding pad of the second interposer, and the fifth bonding pad is at least partially exposed through the dielectric layer; and wherein the fourth bonding pad is electrically connected to the fifth bonding pad via the third communication.

17. The semiconductor package structure of claim 14, further comprising:

a first molding disposed over the dielectric layer and surrounding the second die and the third die; and a second molding disposed over the first bonding layer and surrounding the first die, the first molding and the second interposer.

18. The semiconductor package structure of claim 14, further comprising:

a first via extending through the first substrate;

a conductive bump disposed under the first substrate and electrically coupled to the first via; and a second via extending through the second substrate, wherein the first die is electrically connected to the second die via the first communication member and the second via.

* * * * *